United States Patent
Seo et al.

(10) Patent No.: US 9,972,805 B2
(45) Date of Patent: May 15, 2018

(54) ORGANIC LIGHT EMITTING DISPLAY PANEL AND METHOD OF MANUFACTURING THE SAME

(71) Applicant: LG DISPLAY CO., LTD., Seoul (KR)

(72) Inventors: Jeong-Dae Seo, Incheon (KR);
Chang-Wook Han, Seoul (KR);
Yoon-Heung Tak, Goyang-si (KR);
Hyo-Seok Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 704 days.

(21) Appl. No.: 13/872,689

(22) Filed: Apr. 29, 2013

(65) Prior Publication Data
US 2014/0117322 A1 May 1, 2014

(30) Foreign Application Priority Data
Oct. 31, 2012 (KR) .................. 10-2012-0122752

(51) Int. Cl.
*H01L 51/00* (2006.01)
*H01L 51/52* (2006.01)
*H01L 27/32* (2006.01)

(52) U.S. Cl.
CPC ........ *H01L 51/5253* (2013.01); *H01L 51/006* (2013.01); *H01L 27/3244* (2013.01); *H01L 51/0058* (2013.01)

(58) Field of Classification Search
None
See application file for complete search history.

(56) References Cited

U.S. PATENT DOCUMENTS

| | | | |
|---|---|---|---|
| 6,251,531 B1* | 6/2001 | Enokida | C07C 211/61 313/504 |
| 2005/0260442 A1* | 11/2005 | Yu | C07C 211/61 428/690 |

(Continued)

FOREIGN PATENT DOCUMENTS

| | | |
|---|---|---|
| CN | 101409305 A | 4/2009 |
| CN | 102184936 A | 9/2011 |

OTHER PUBLICATIONS

Office Action for corresponding Chinese Application No. 201310174896.0, dated Dec. 30, 2015, 11 pages.

*Primary Examiner* — J. L. Yang
(74) *Attorney, Agent, or Firm* — Seed IP Law Group LLP

(57) ABSTRACT

An organic light emitting display panel includes a light emitting diode array substrate and an encapsulation substrate adhered to the light emitting array diode substrate by an adhesive film. The light emitting array diode substrate includes a driving thin film transistor formed on a substrate, an organic light emitting diode including a first electrode connected to the driving thin film transistor, an organic emission layer formed on the first electrode, and a second electrode formed on the organic emission layer, and first and second passivation layers formed on the second electrode. In this regard, the first passivation layer is formed of an organic compound having at least one of the structural formulae described in Formula 1 below:

(Continued)

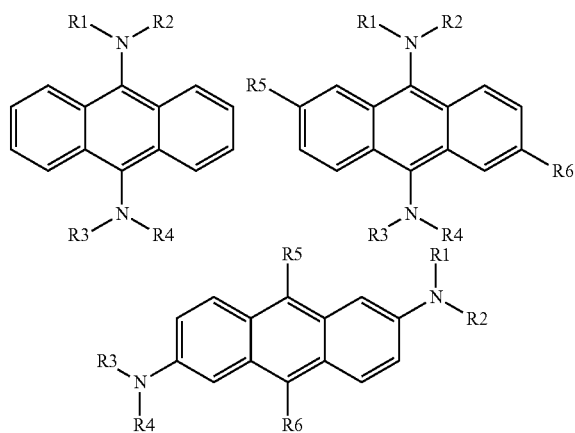

<Formula 1> wherein R1, R2, R3, R4, R5, and R6 are each independently selected from substituted or unsubstituted $C_6$-$C_{40}$ aromatic groups.

13 Claims, 9 Drawing Sheets

(56) References Cited

U.S. PATENT DOCUMENTS

| | | | |
|---|---|---|---|
| 2006/0240277 A1* | 10/2006 | Hatwar | C09K 11/06 428/690 |
| 2007/0052352 A1 | 3/2007 | Im et al. | |
| 2008/0157656 A1* | 7/2008 | Liao | B82Y 20/00 313/504 |

* cited by examiner

ORGANIC LIGHT EMITTING DISPLAY PANEL AND METHOD OF MANUFACTURING THE SAME

This application claims the benefit of priority of Korean Patent Application No. 10-2012-0122752, filed on Oct. 31, 2012, which is hereby incorporated by reference as if fully set forth herein.

BACKGROUND

Field of the Disclosure

The present disclosure relates to an organic light emitting display panel and a method of manufacturing the same, and more particularly, to an organic light emitting display panel that has increased life by preventing moisture or oxygen from permeating an organic light emitting diode and is manufactured at reduced cost and a method of manufacturing the same.

Discussion of the Related Art

Conventional organic light emitting display devices, which are self-emissive devices, do not require backlight unit and thus may be lightweight and thin and be manufactured using a simplified manufacturing process. In addition, these organic light emitting display devices have wide viewing angles, a rapid response time, a high contrast ratio, and the like and thus are suitable for use as a next generation flat panel display.

In particular, an organic light emitting display panel includes a light emitting diode array substrate including driving thin film transistors (TFTs), organic light emitting diodes respectively connected to the driving TFTs, and a passivation layer formed to protect the organic light emitting diodes, and an encapsulation substrate adhered to the light emitting diode array substrate by an adhesive film.

In this regard, the passivation layer generally has high thermal stability and is formed of $Alq_3$, which is inexpensive. When $Alq_3$ is deposited, however, ash is generated and thus the passivation layer is not uniformly deposited on the organic light emitting diode.

In other words, due to generation of ash, the ash is deposited together with the passivation layer, and thus the passivation layer is not uniformly formed. Due to non-uniform deposition of the passivation layer, a gap is formed between an anode and the passivation layer and thus moisture or oxygen permeates the gap therebetween.

As described above, since moisture or oxygen is permeated between the anode and the passivation layer, life of an organic light emitting diode is reduced.

In addition, to complement a material constituting $Alq_3$, an organic material such as DNTPD or IDE406 is used as a material forming a passivation layer. However, costs of the organic materials are high, which results in increase in manufacturing costs of an organic light emitting display panel.

SUMMARY

An organic light emitting display panel includes a driving thin film transistor formed on a substrate, an organic light emitting diode including a first electrode connected to the driving thin film transistor, an organic emission layer formed on the first electrode, and a second electrode formed on the organic emission layer, and first and second passivation layers formed on the second electrode, a light emitting diode array substrate including the driving thin film transistor, the organic light emitting diode, the first passivation layer and the second passivation layer and an encapsulation substrate adhered to the light emitting diode array substrate by an adhesive film, wherein the first passivation layer is formed of an organic compound having at least one of the structural formulae described in Formula 1 below:

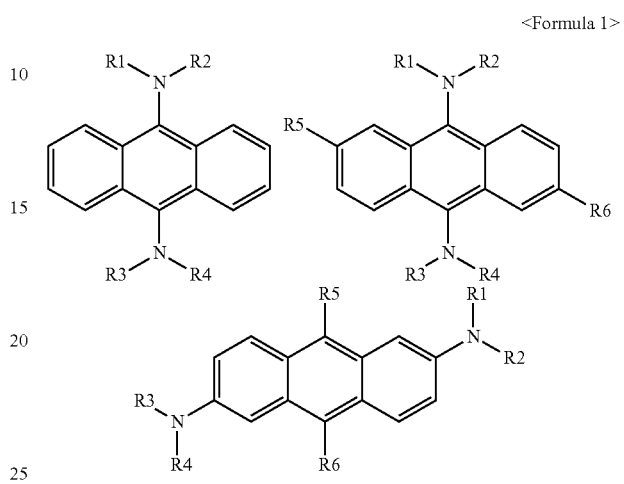

<Formula 1> wherein R1, R2, R3, R4, R5, and R6 are each independently selected from substituted or unsubstituted $C_6$-$C_{40}$ aromatic groups.

In another aspect of the present invention, a method of manufacturing an organic light emitting display panel includes forming a driving thin film transistor on a substrate, forming a first electrode to be connected to the driving thin film transistor, forming an organic emission layer and a second electrode on the first electrode, forming a first passivation layer on the second electrode, forming a second passivation layer over the substrate with the first passivation layer formed thereon, and adhering a light emitting diode array substrate including the driving thin film transistor, the first electrode, the organic emission layer, the second electrode, the first passivation layer, and the second passivation layer to an encapsulation substrate by an adhesive film, wherein the first passivation layer is formed of an organic compound having at least one of the structural formulae described in Formula 1 below:

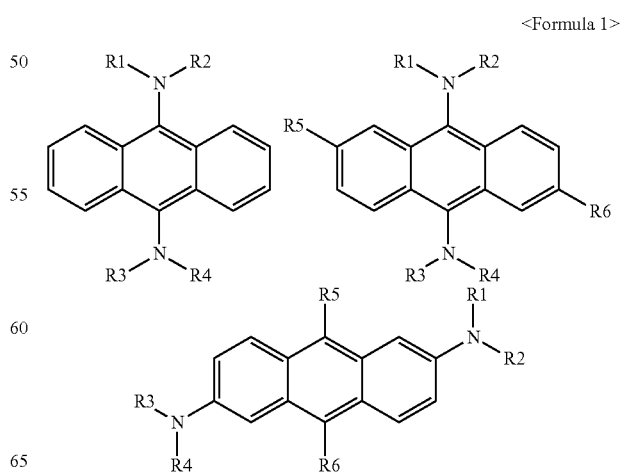

<Formula 1> wherein R1, R2, R3, R4, R5, and R6 are each independently selected from substituted or unsubstituted $C_6$-$C_{40}$ aromatic groups.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts. When it is determined that a detailed description of the related art may unnecessarily obscure the subject matter of the present invention, a description thereof will be omitted.

Hereinafter, embodiments of the present invention will be described in detail with reference to FIGS. 2 through 5.

Figure 1:
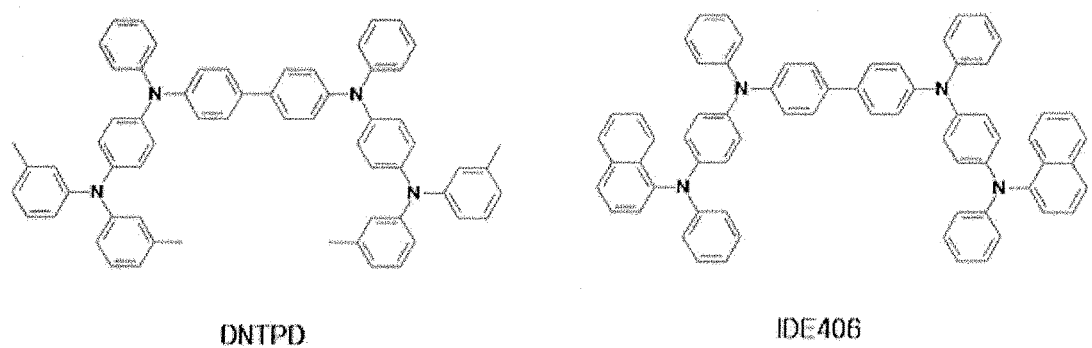
FIG. 1 illustrates structural formulae of DNTPD and IDE406 as a compound used in a conventional hole injection layer.
Figure 2:
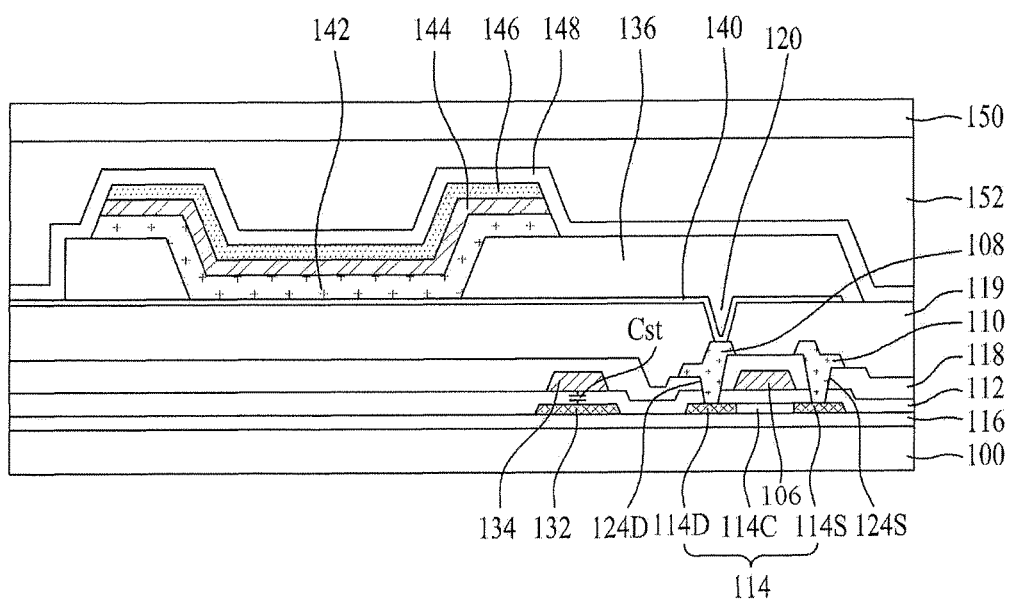
FIG. 2 is a sectional view of an organic light emitting display panel according to an embodiment of the present invention.
Figure 3:
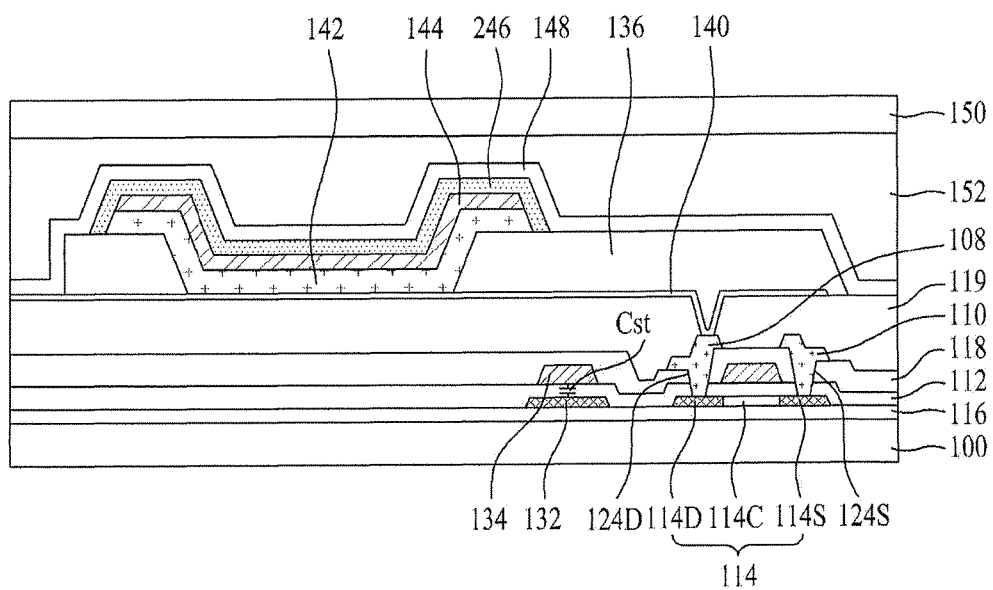
FIG. 3 is a sectional view illustrating another example of a first protective layer.

FIG. 2 is a sectional view of an organic light emitting display panel according to an embodiment of the present invention. FIG. 3 is a sectional view illustrating another example of a first passivation layer.

As illustrated in FIG. 2, the organic light emitting display panel includes a light emitting diode array substrate and an encapsulation substrate 150 adhered to the light emitting diode array substrate by an adhesive film 152.

The light emitting diode array substrate includes a driving thin film transistor (TFT) formed on a substrate 100, an organic light emitting diode connected to the driving TFT, and first and second passivation layers 146 and 148 to protect the organic light emitting diode.

In the driving TFT, as illustrated in FIG. 2, a buffer layer 116 and an active layer 114 are formed on the substrate 100, and a gate electrode 106 is formed to correspond to a channel region 114c of the active layer 114, with a gate insulating layer 112 intervening therebetween. Source and drain electrodes 110 and 108 are provided therebetween with the gate electrode 106 and an interlayer insulating layer 118 to be insulated from each other. The source and drain electrodes 110 and 108 are respectively connected to source and drain regions 114S and 114D of the active layer 114 which are formed by injection of n+ impurities via a source contact hole 124S and a drain contact hole 124D, respectively, each of which penetrates the interlayer insulating layer 118 and the gate insulating layer 112. In addition, the active layer 114 may further include the channel region 114C and a lightly doped drain (LDD) region (not shown) formed between the source and drain regions 114S and 114D by injection of n- impurities, to reduce off-current. In addition, a pixel protective layer 119 formed of an organic insulating material is formed on the driving TFT formed on the substrate 100. Alternatively, the pixel protective layer 119 on the driving TFT may have a double-layered structure including an inorganic protective layer and an organic protective layer.

The organic light emitting diode includes a first electrode 140 connected to the drain electrode 108 via a pixel contact hole 120, a bank insulating layer 136 having a bank hole to expose the first electrode 140, an organic emission layer (EML) 142 formed on the first electrode 140 and including a light emitting layer, and a second electrode 144 formed on the organic EML 142. In the organic light emitting diode, when a voltage is applied between the first electrode 140 and the second electrode 144, holes are injected from the first electrode 140, electrons are injected from the second electrode 144, and injected holes and electrons are recombined in the organic EML 142 to generate excitons. When the generated excitons drop to a ground state, light is emitted from the organic EML 142.

The organic EML 142 may include, in this order, a hole-related layer, the EML, an electron-related layer or include these layers in reverse order. For example, the organic EML 142 may include a hole injection layer (HIL), a hole transport layer (HTL), the EML, an electron transport layer (ETL), and an electron injection layer (EIL).

The first passivation layer 146 is formed on the second electrode 144 to prevent the organic EML 142 and the second electrode 144 from being damaged by moisture, oxygen, or the like and prevent deterioration of luminous properties. For this operation, the first passivation layer 146 may be formed of an organic compound having at least one of the structural formulae described in Formula 1 below.

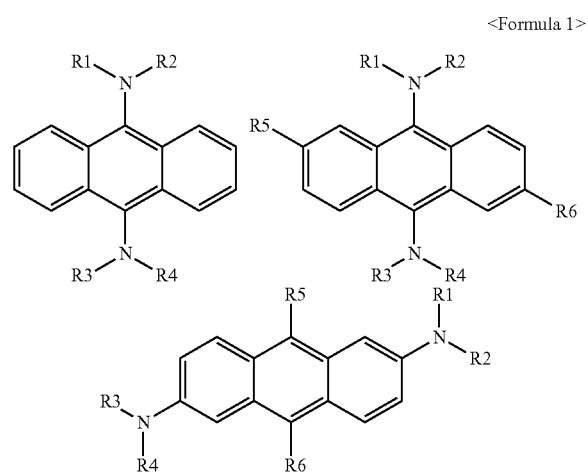

<Formula 1>

In Formula 1, R1, R2, R3, R4, R5, and R6 may be each independently a substituted or unsubstituted $C_6$-$C_{40}$ aromatic group.
The organic compound having at least one of the structural formulae of Formula 1 is selected from HM-01 through HM-65.
HM-01
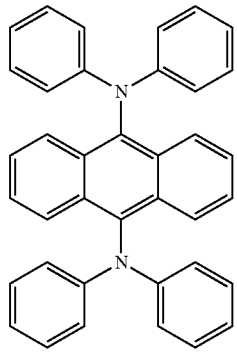
HM-02
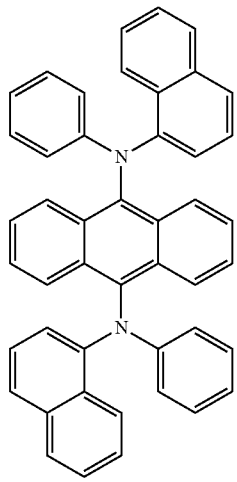
HM-03
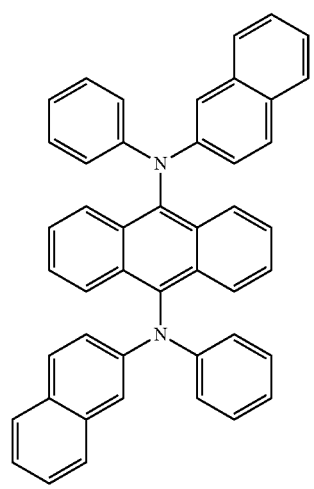
HM-04
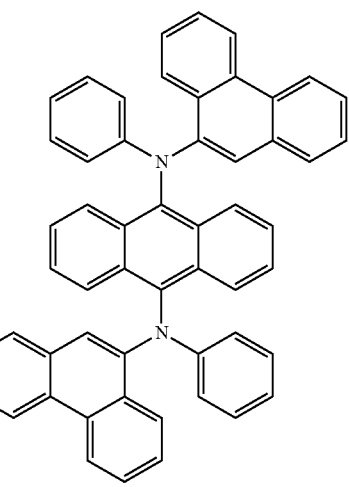
HM-05
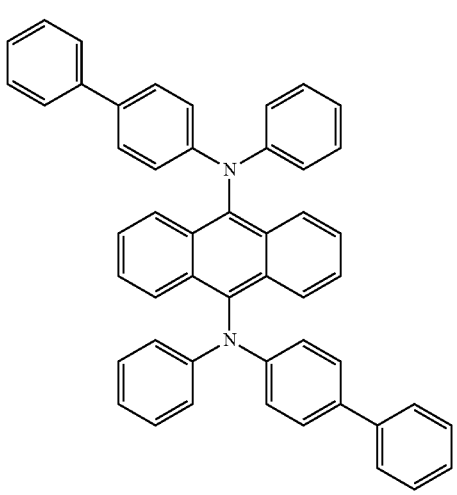
HM-06
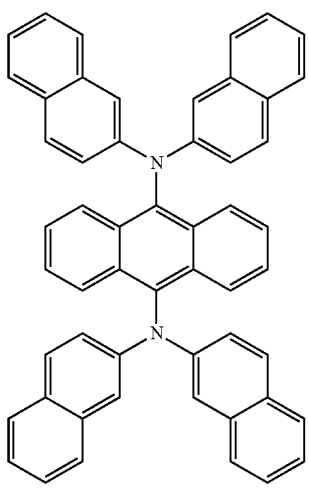

HM-07
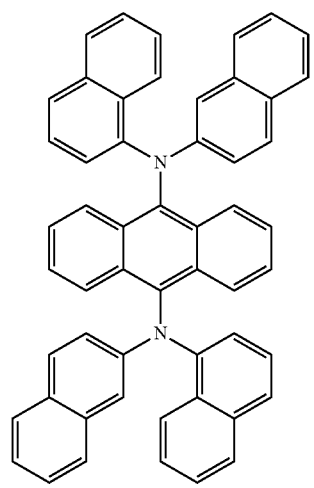
HM-10
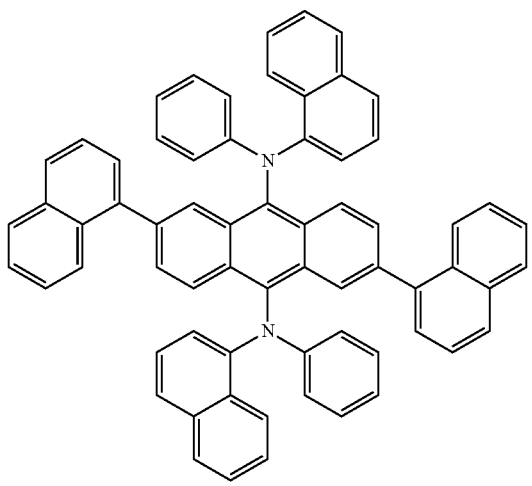
HM-08
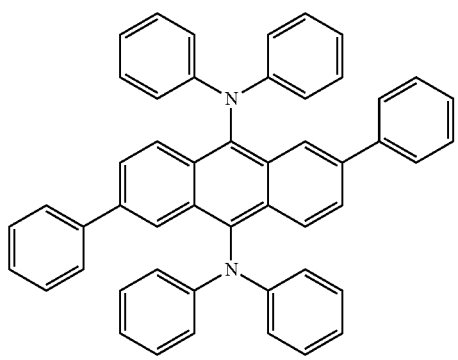
HM-11
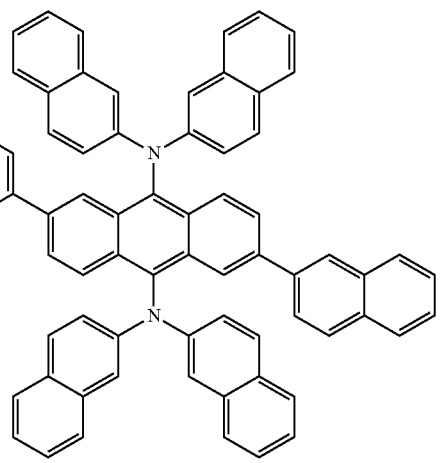
HM-09
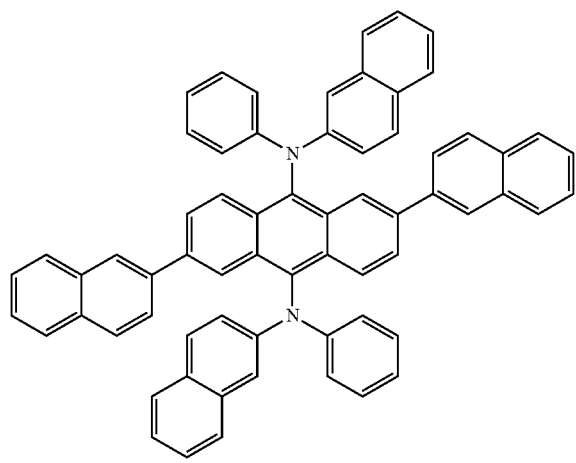
HM-12
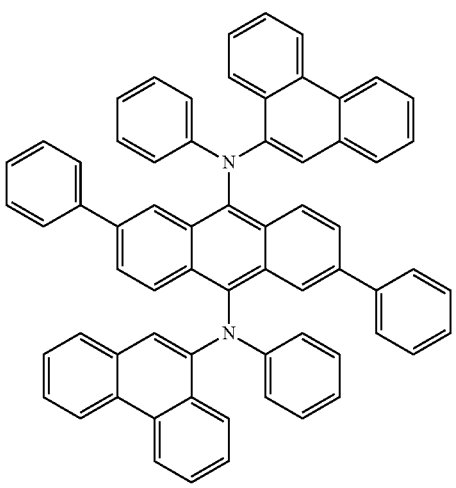

HM-13
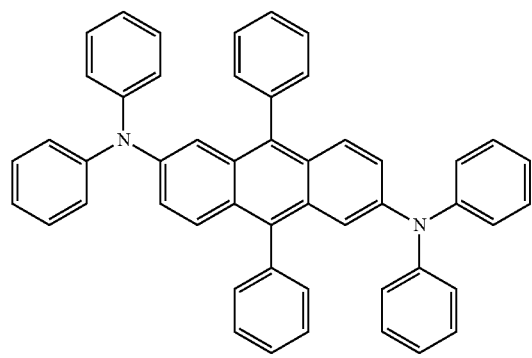
HM-16
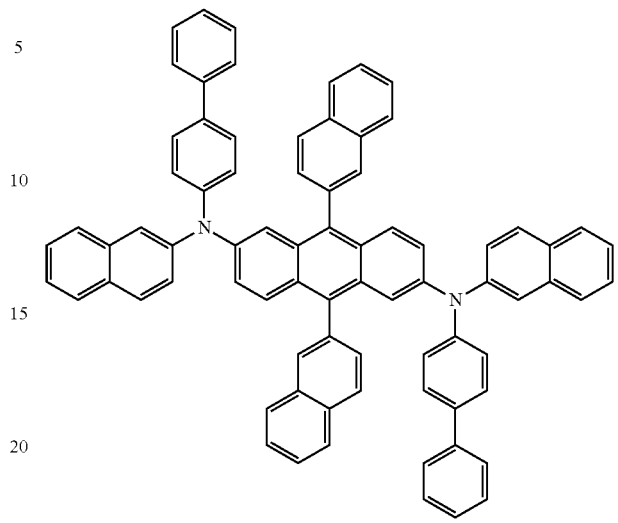
HM-14
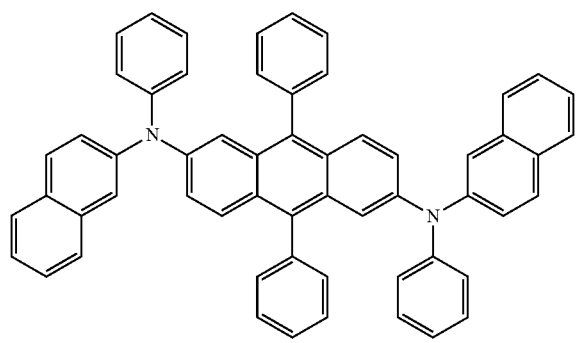
HM-17
HM-15
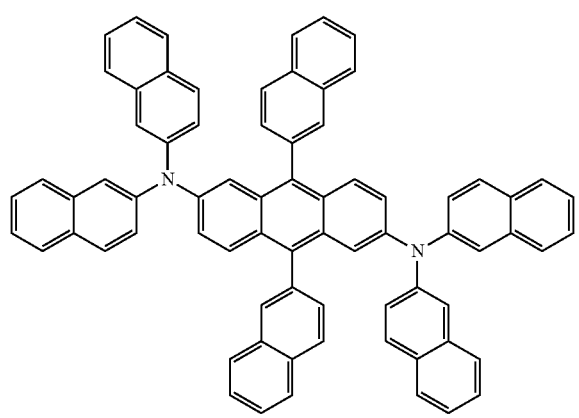
HM-18
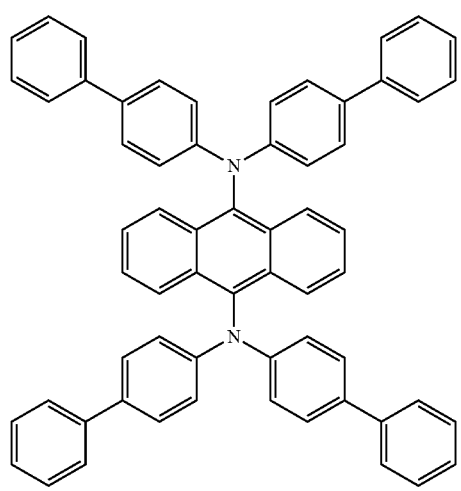

HM-19
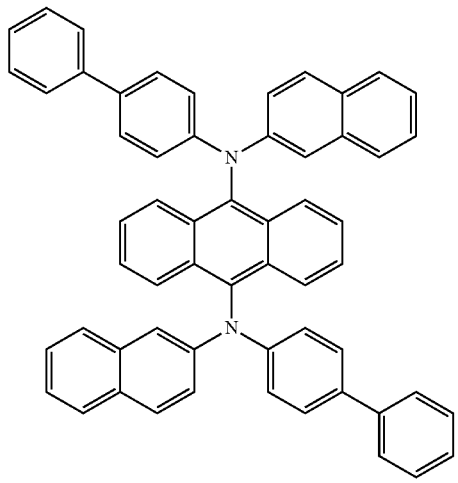
HM-22
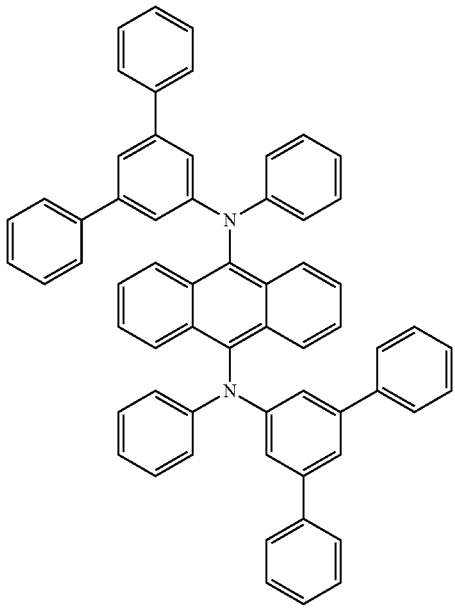
HM-20
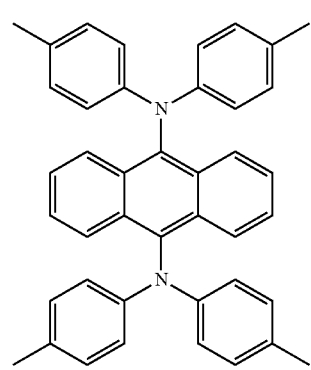
HM-21
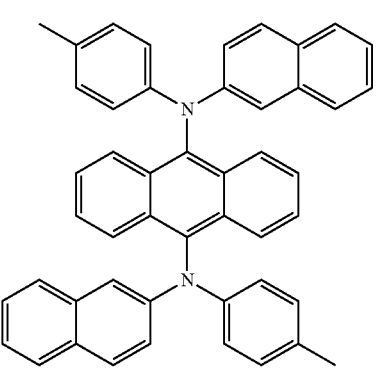
HM-23
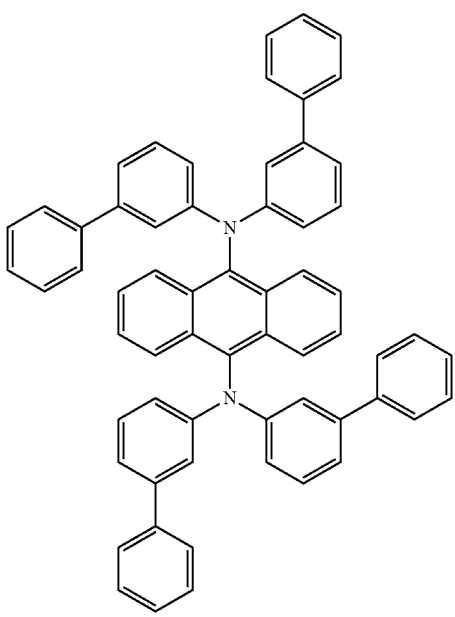

HM-24
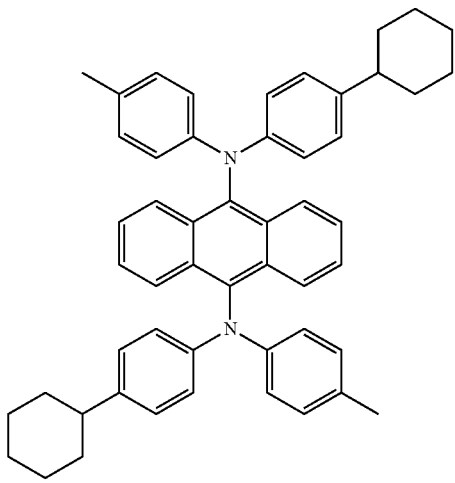
HM-27
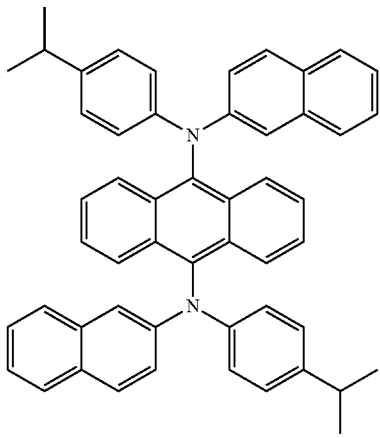
HM-25
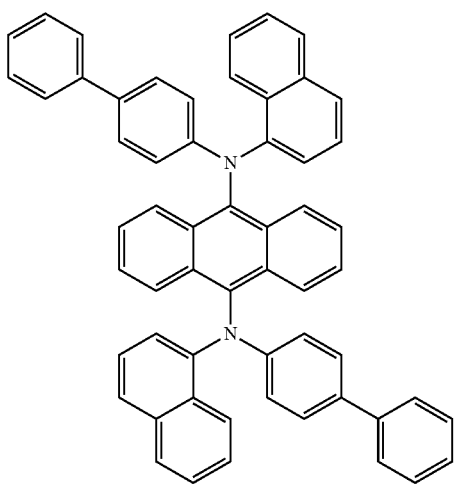
HM-28
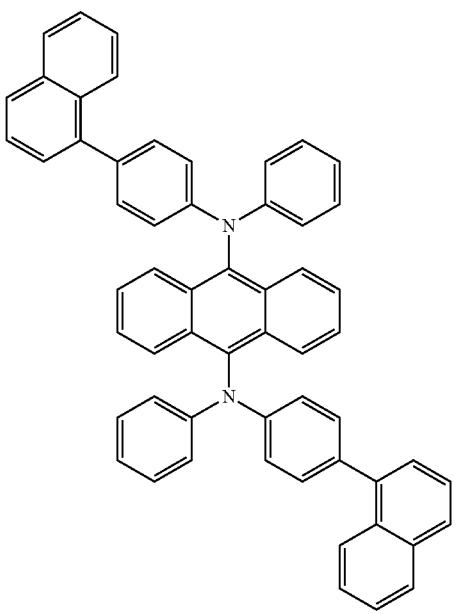
HM-26
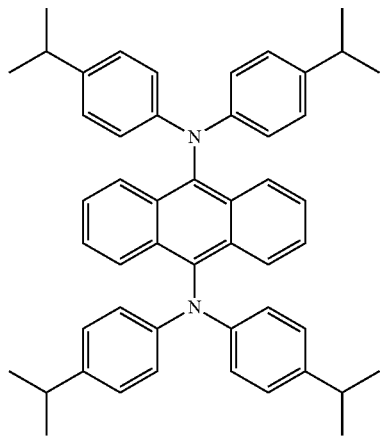
HM-29
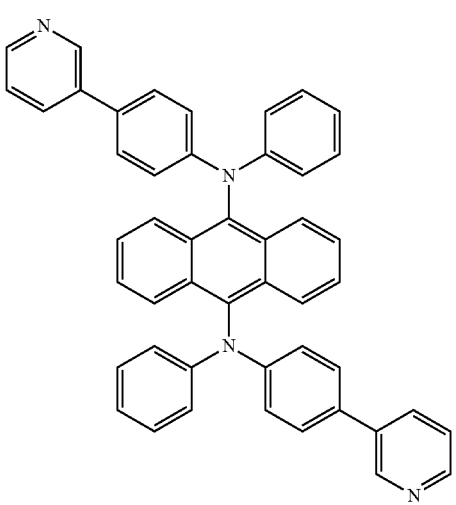

HM-30
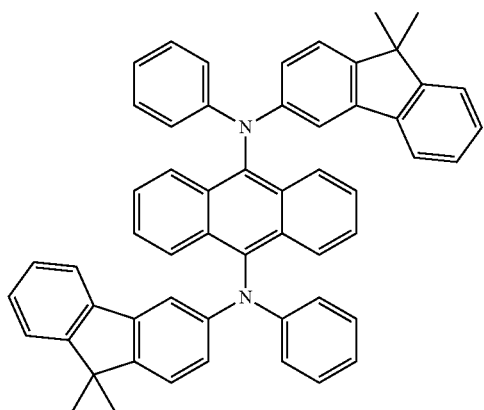
HM-31
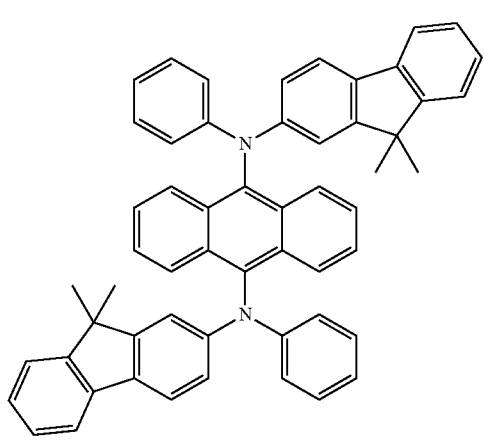
HM-32
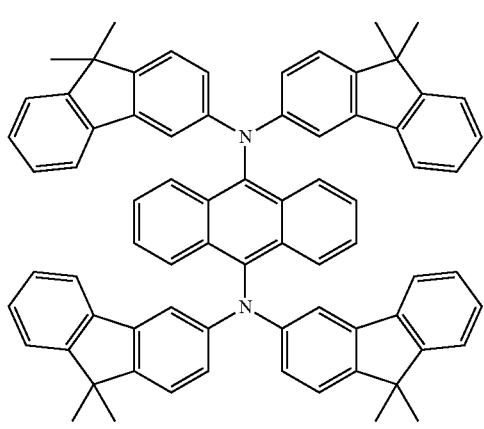
HM-33
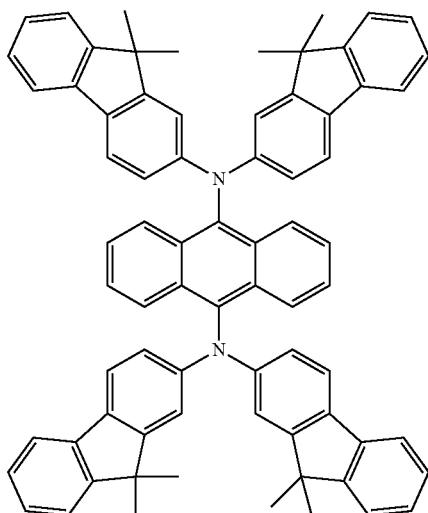
HM-34
HM-35
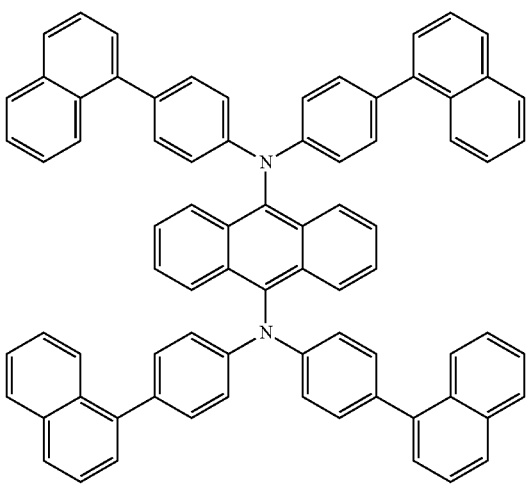

HM-36
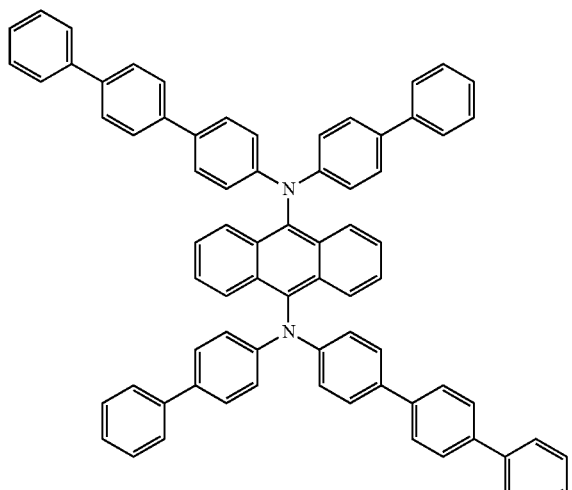
HM-37
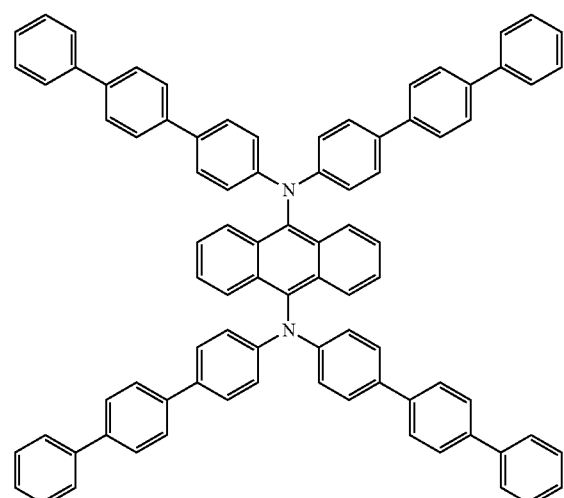
HM-38
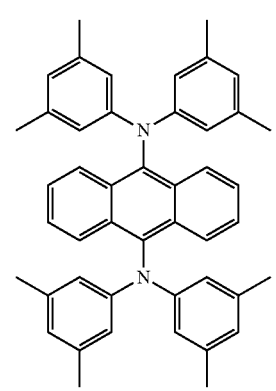
HM-39
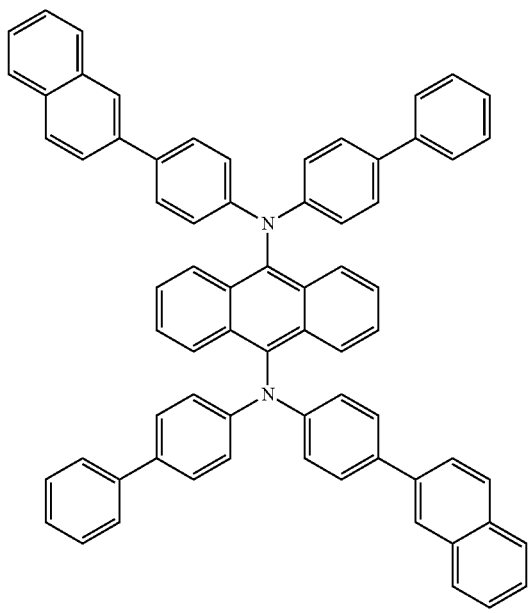
HM-40
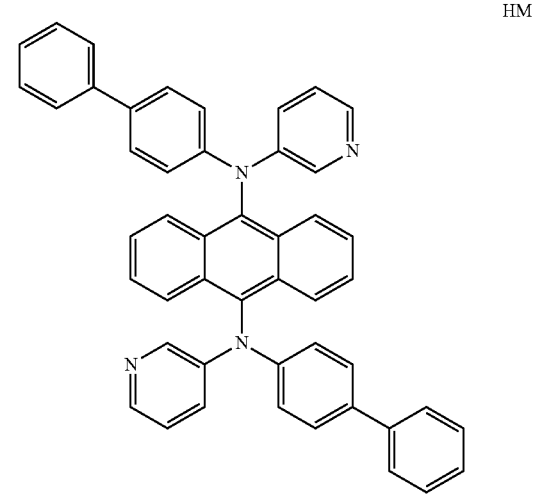
HM-41
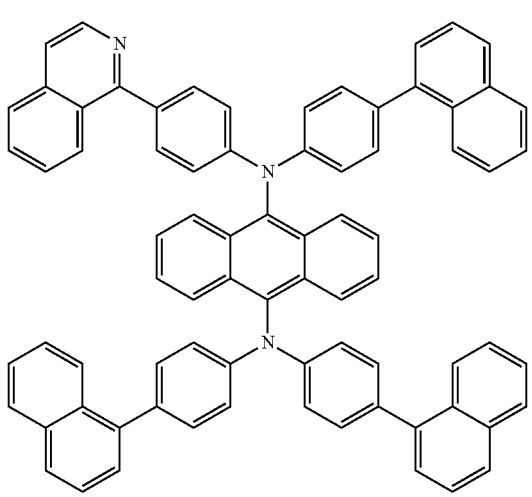

HM-42
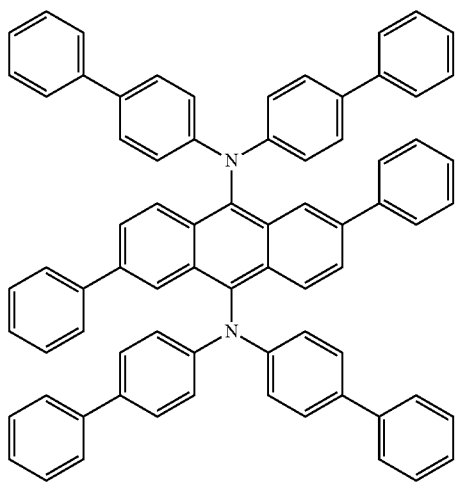
HM-43
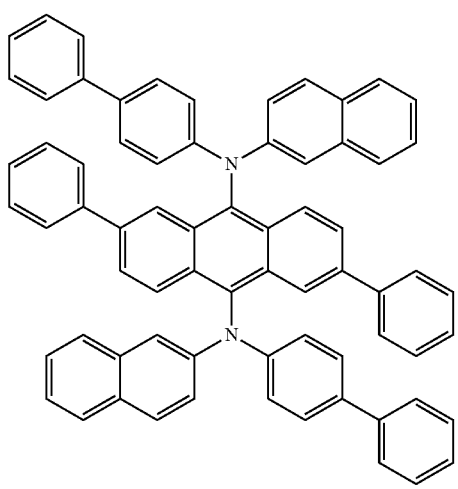
HM-44
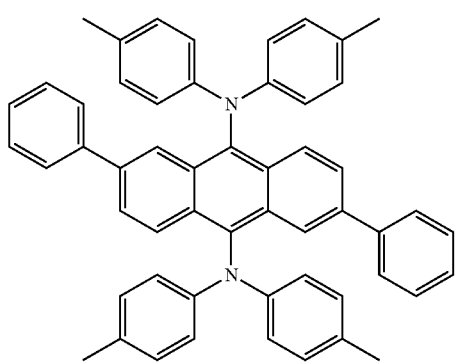
HM-45
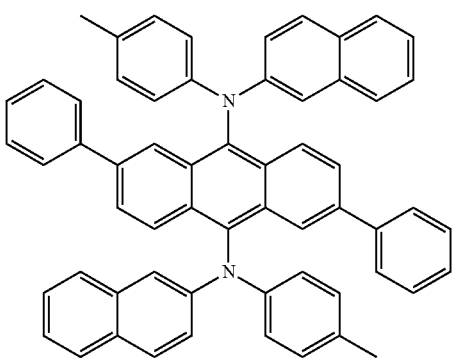
HM-46
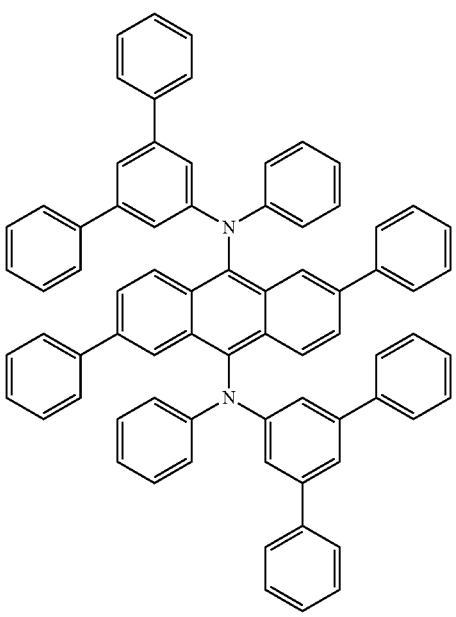
HM-47
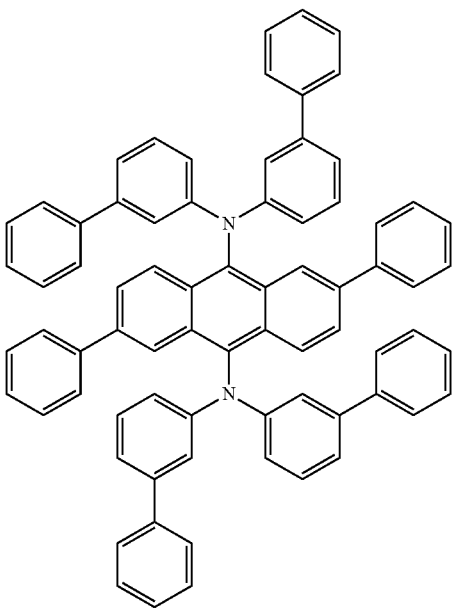

HM-48
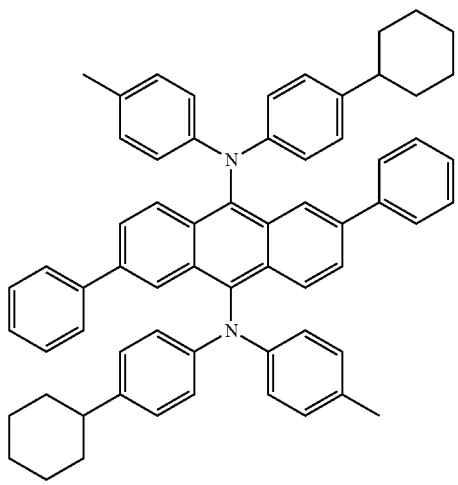
HM-49
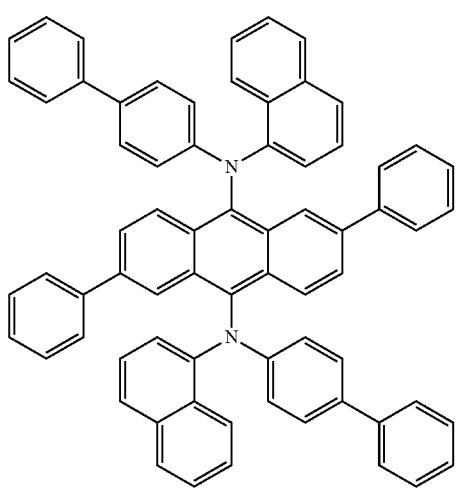
HM-50
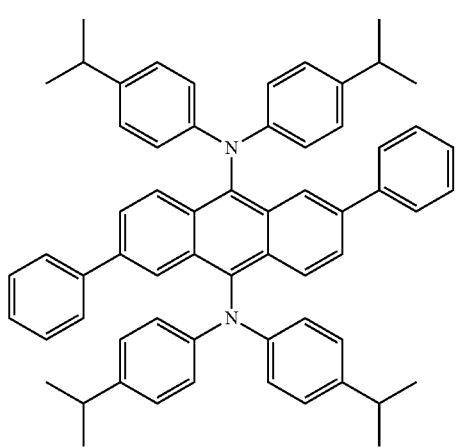
HM-51
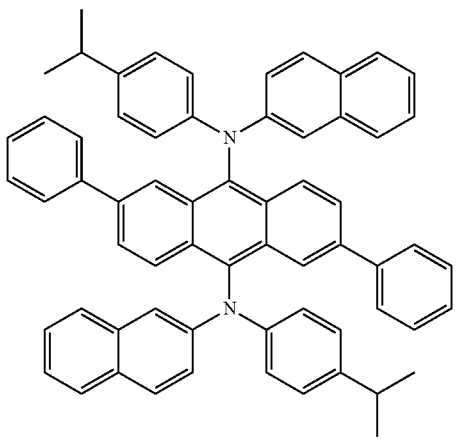
HM-52
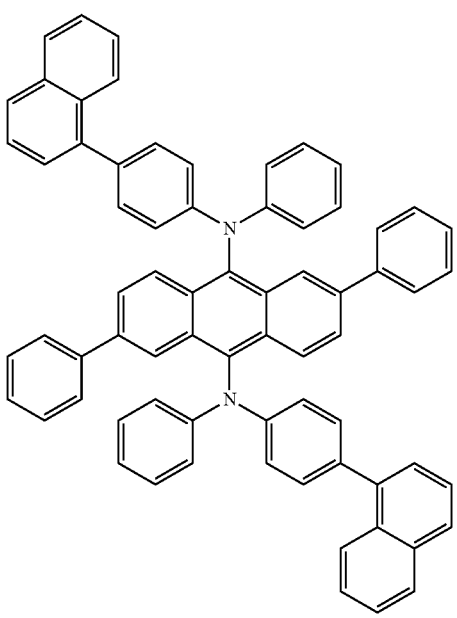
HM-53
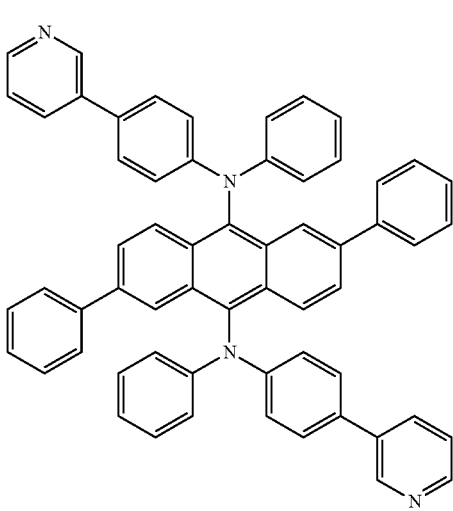

HM-54
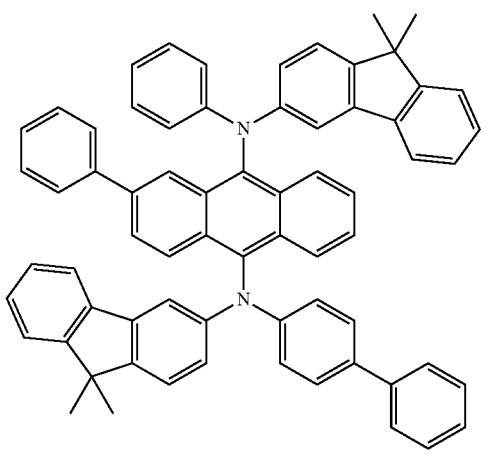
HM-55
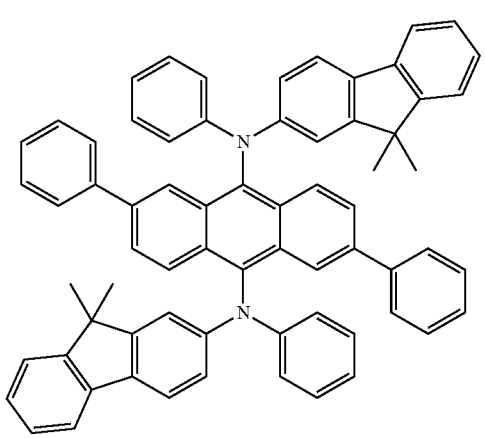
HM-56
HM-57
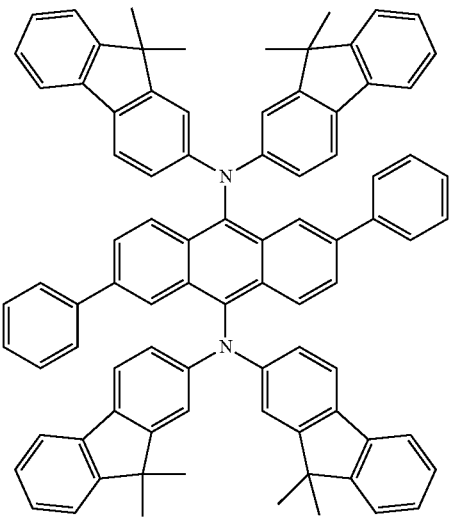
HM-58
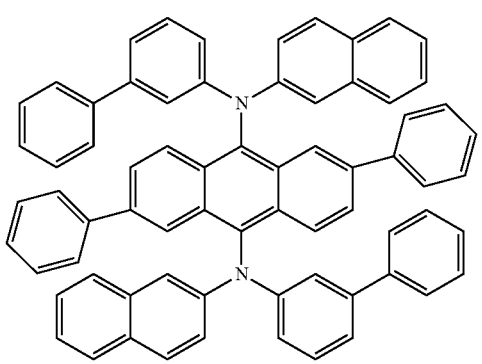
HM-59
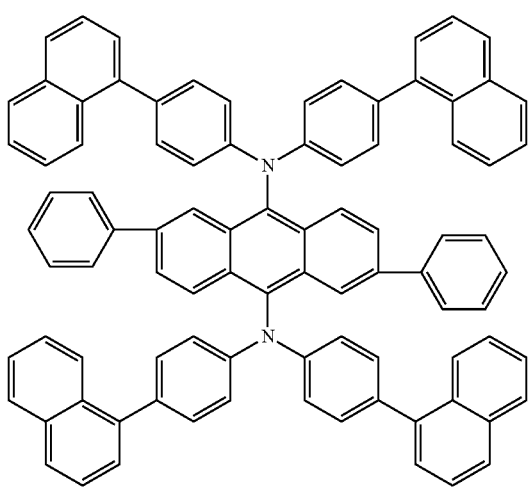

HM-60

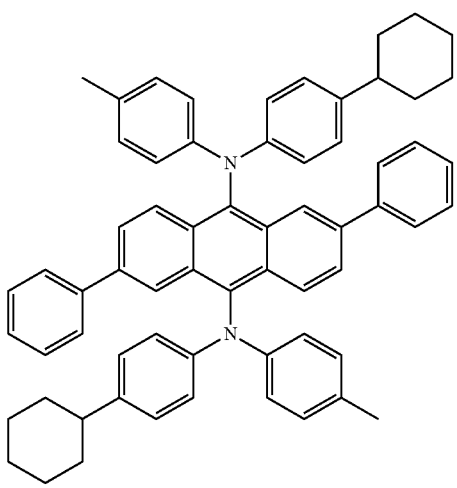

HM-65

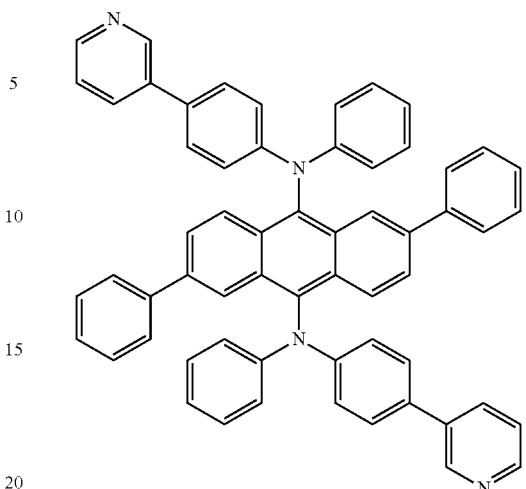

HM-61

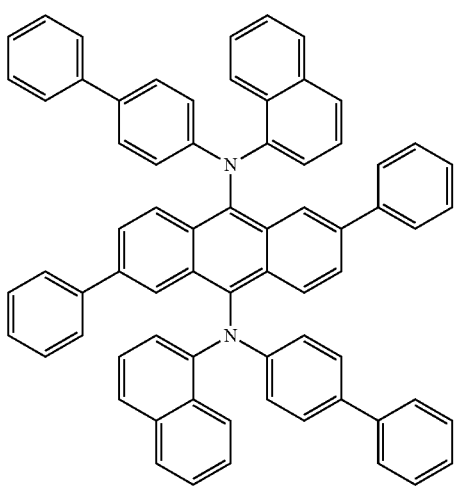

HM-62

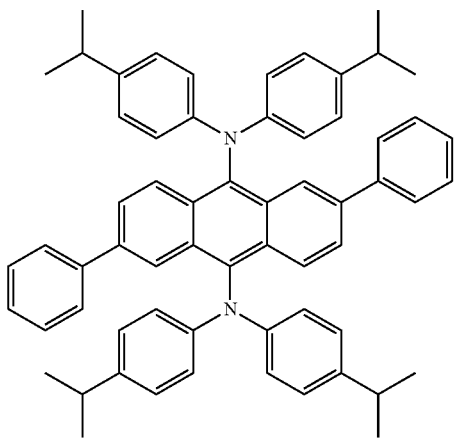

When the organic compound having at least one of the structural formulae of Formula 1 is used to form the first passivation layer 146, ash is not generated when the first passivation layer 146 is formed by deposition. Accordingly, the first passivation layer 146 is uniformly and smoothly formed on the second electrode 144, and a second passivation layer 148 is also uniformly formed on the first passivation layer 146. As described above, since the first and second passivation layers 146 and 148 are smoothly and uniformly formed, permeation of moisture or oxygen into the organic light emitting diode may be prevented, and thus lifespan of the organic light emitting diode may be improved.

In this regard, as illustrated in FIG. 2, the first passivation layer 146 may be formed over the second electrode 144. In another embodiment, as illustrated in FIG. 3, a first passivation layer 246 may be entirely formed on the organic EML 142 and the second electrode 144 to cover side surfaces of the organic EML 142 and the second electrode 144. When the first passivation layer 246 is formed as illustrated in FIG. 3, permeation of moisture, hydrogen, and oxygen into the side and upper surfaces of the second electrode 144 and the organic EML 142 may be prevented.

The second passivation layer 148 is formed between the organic light emitting diode and the adhesive film 152 and thus may prevent damage to the organic light emitting diode by moisture or oxygen or deterioration of luminous properties of the organic light emitting diode. In particular, the second passivation layer 148 contacts the adhesive film 152 and thus may prevent permeation of moisture, hydrogen, and oxygen into side and front surfaces of the organic light emitting diode. For example, the second passivation layer 148 may be an inorganic insulating layer formed of $SiN_x$ or $SiO_x$.

A storage capacitor Cst includes a lower storage electrode 132 and an upper storage electrode 134 that are doped with p+ or n+ impurities and formed to correspond to each other with the gate insulating layer 112 intervening therebetween. The storage capacitor Cst stably maintains a data signal with which the first electrode 140 is charged until a next data signal is charged.

FIGS. 4A through 4J are sectional views sequentially illustrating a method of manufacturing the organic light emitting display panel, according to an embodiment of the present invention.

Figure 4A:
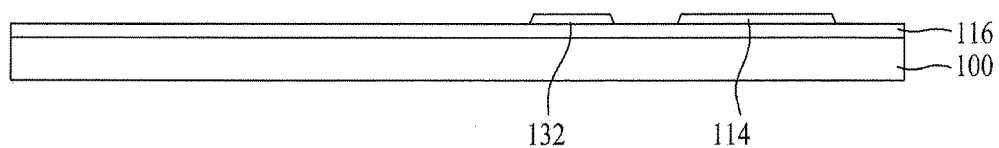
FIGS. 4A through 4J are sectional views sequentially illustrating a method of manufacturing the organic light emitting display panel, according to an embodiment of the present invention.

Referring to FIG. 4A, the buffer layer 116 is formed on the substrate 100, and the active layer 114 and the lower storage electrode 132 are formed on the buffer layer 116.

In particular, the buffer layer 116 is formed over the substrate 100 using an inorganic insulating material such as silicon oxide ($SiO_2$) or the like by deposition such as chemical vapor deposition (CVD), plasma enhanced CVD, or the like. The active layer 114 is formed by depositing amorphous silicon on the buffer layer 116, crystallizing the amorphous silicon using a laser to form polycrystalline-silicon, and patterning the polycrystalline-silicon by photolithography and etching using a mask. In addition, a dehydrogenation process for the removal of hydrogen atoms existing in a thin film of amorphous silicon may be further performed before the crystallization process.

Figure 4B:
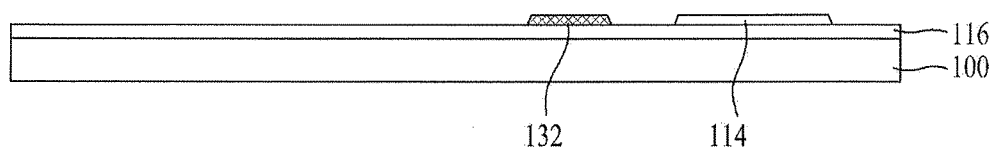

Referring to FIG. 4B, the lower storage electrode 132 is doped with an impurity to have conductivity.

In particular, a mask is formed on the substrate 100 on which the active layer 114 of the driving TFT and the lower storage electrode 132 are formed to expose the lower storage electrode 132. The exposed lower storage electrode 132 is doped with a p+ impurity or an n+ impurity to have conductivity.

Figure 4C:
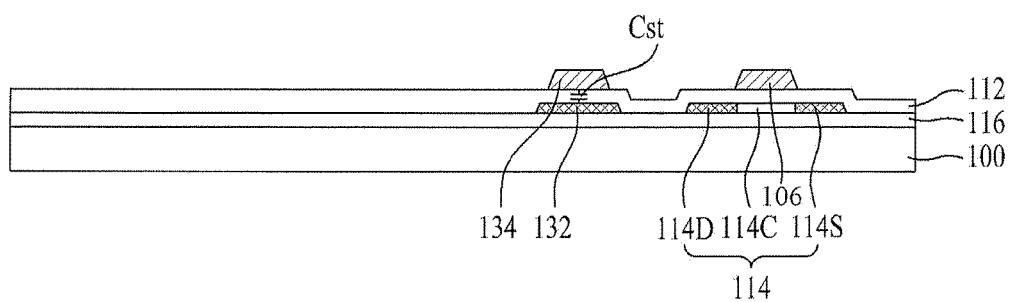

Referring to FIG. 4C, the gate insulating layer 112 is formed on the buffer layer 116 with the active layer 114 formed thereon, the gate electrode 106 and the upper storage electrode 134 are formed thereon, and the source and drain regions 114S and 114D and the channel region 114C of the active layer 114 are formed such that the channel region 114C is formed between the source and drain regions 114S and 114D.

In particular, the gate insulating layer 112 is formed by depositing an inorganic insulating material such as silicon oxide ($SiO_2$) over the buffer layer 116 on which the active layer 114 is formed, by PECVD or CVD. Subsequently, a gate metal layer is formed on the gate insulating layer 112 using a deposition method such as sputtering. The gate metal layer may have a single- or multi-layered structure formed of molybdenum (Mo), aluminum (Al), chromium (Cr), or an alloy thereof. Thereafter, the gate metal layer is patterned by photolithography and etching using a mask to form the gate electrode 106 and the upper storage electrode 134. As a result, the gate electrode 106 overlaps with the active layer 114, provided therebetween with the gate insulating layer 112, and the upper storage electrode 134 overlaps with the lower storage electrode 132, provided therebetween with the gate insulating layer 112.

Non-overlapped regions of the active layer 114 with respect to the gate electrode 106 are doped with an n+ impurity using the gate electrode 106 as a mask to form the source and drain regions 114S and 114D of the active layer 114 that are doped with the n+ impurity.

Figure 4D:
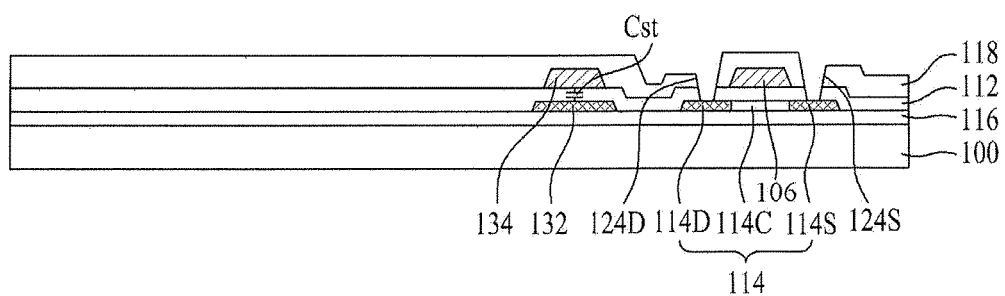

Referring to FIG. 4D, the interlayer insulating layer 118 is formed on the gate insulating layer 112 on which the gate electrode 106 is formed, and the source and drain contact holes 124S and 124D are formed to penetrate the gate insulating layer 112 and the interlayer insulating layer 118.

In particular, the interlayer insulating layer 118 is formed by depositing an inorganic insulating material such as silicon oxide, silicon nitride, or the like over the gate insulating layer 112 with the gate electrode 106 formed thereon using a deposition method such as PECVD or CVD. Subsequently, the source and drain contact holes 124S and 124D are formed by photolithography and etching using a mask to penetrate the gate insulating layer 112 and the interlayer insulating layer 118. The source and drain contact holes 124S and 124D respectively expose the source and drain regions 114S and 114D.

Figure 4E:
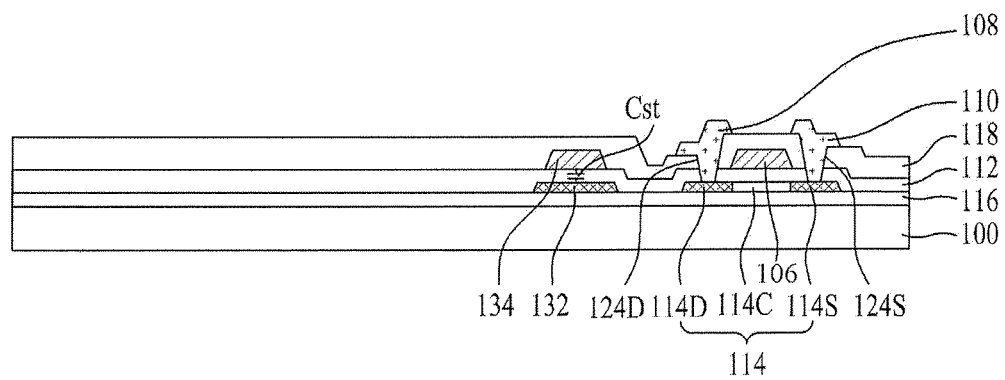

Referring to FIG. 4E, the source and drain electrodes 110 and 108 are formed on the substrate 100 on which the interlayer insulating layer 118 is formed.

In particular, a source and drain metal layer is formed on the interlayer insulating layer 118 using a deposition method such as sputtering and the source and drain metal layer is patterned by photolithography and etching using a mask to form the source and drain electrodes 108 and 110. The source electrode 108 and the drain electrode 110 respectively contact the source region 114S and the drain region 114D of the active layer 114 via the source contact hole 124S and the drain contact hole 124D, respectively.

Figure 4F:
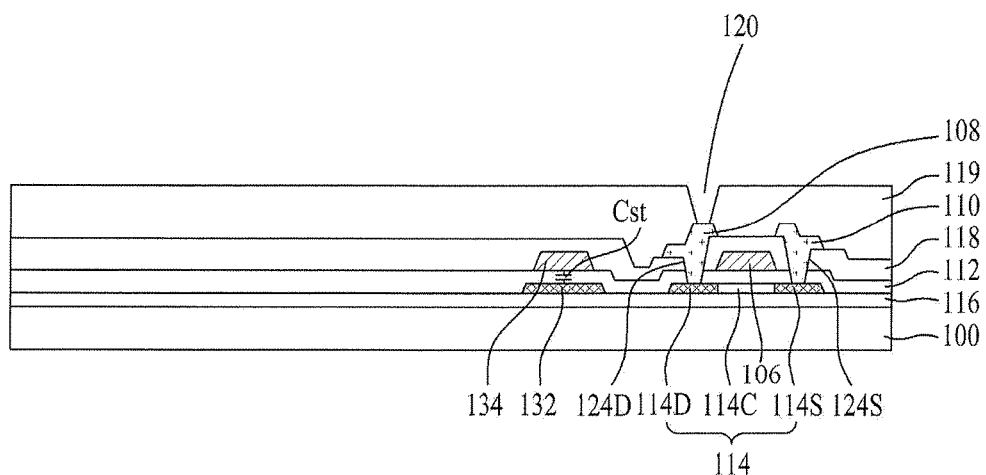

Referring to FIG. 4F, the pixel protective layer 119 having the pixel contact hole 120 is formed on the substrate 100 on which the source and drain electrodes 110 and 108 are formed.

In particular, the pixel protective layer 119 is formed on the substrate 100 with the source and drain electrodes 110 and 108 formed thereon by PECVD or CVD. The pixel protective layer 119 may be formed of an inorganic insulating material or an organic insulating material. Alternatively, two pixel protective layers formed of an inorganic insulating material and an organic insulating material may be formed. The pixel protective layer 119 is patterned by photolithography and etching using a mask to form the pixel contact hole 120 penetrating the pixel protective layer 119. The pixel contact hole 120 exposes the drain electrode 108.

Figure 4G:
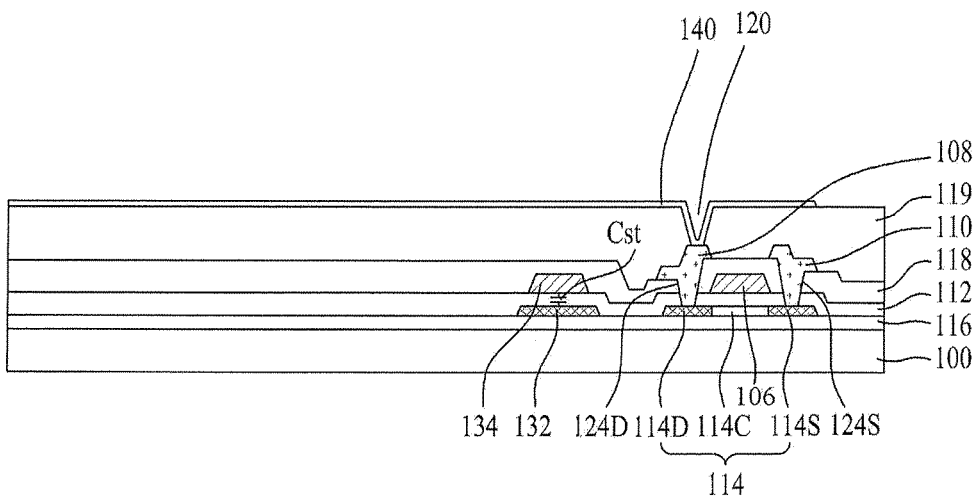

Referring to FIG. 4G, the first electrode 140 of the organic light emitting diode is formed to be connected to the drain electrode 108 of the driving TFT via the pixel contact hole 120.

In particular, a transparent conductive electrode layer formed of a transparent conductive oxide (TCO), indium tin oxide (ITO), indium zinc oxide (IZO), or the like is formed on the pixel protective layer 119 using a deposition method such as sputtering and the transparent conductive electrode layer is patterned by photolithography and etching using a mask to form the first electrode 140.

Figure 4H:
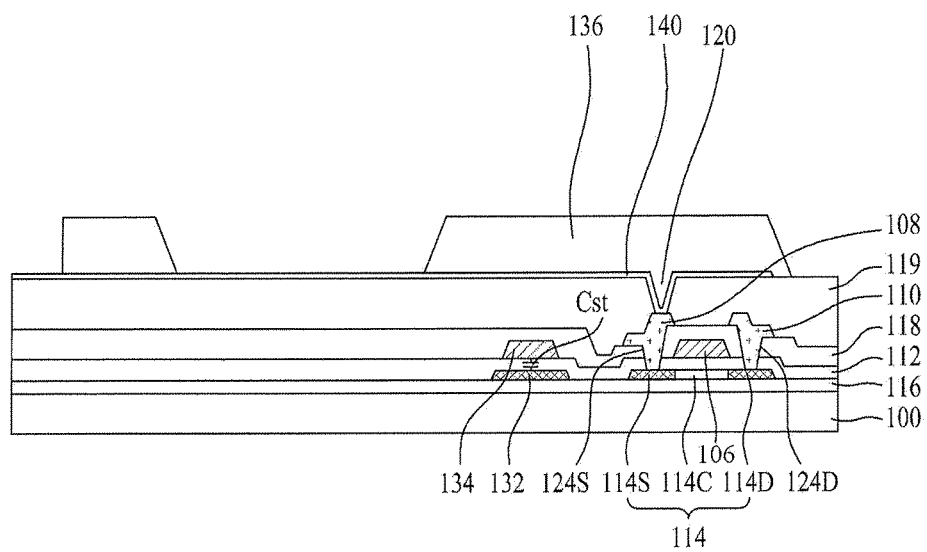

Referring to FIG. 4H, the bank insulating layer 136 having a bank hole is formed on the substrate 100 on which the first electrode 140 is formed.

In particular, an organic insulating material such as an acryl-based resin is entirely coated on the substrate 100 with the first electrode 140 formed thereon, by spinless or spin coating. Thereafter, a coating layer of the organic insulating material is patterned by photolithography and etching using a mask to form the bank insulating layer 136 having a bank hole through which the first electrode 140 is exposed.

Figure 4I:
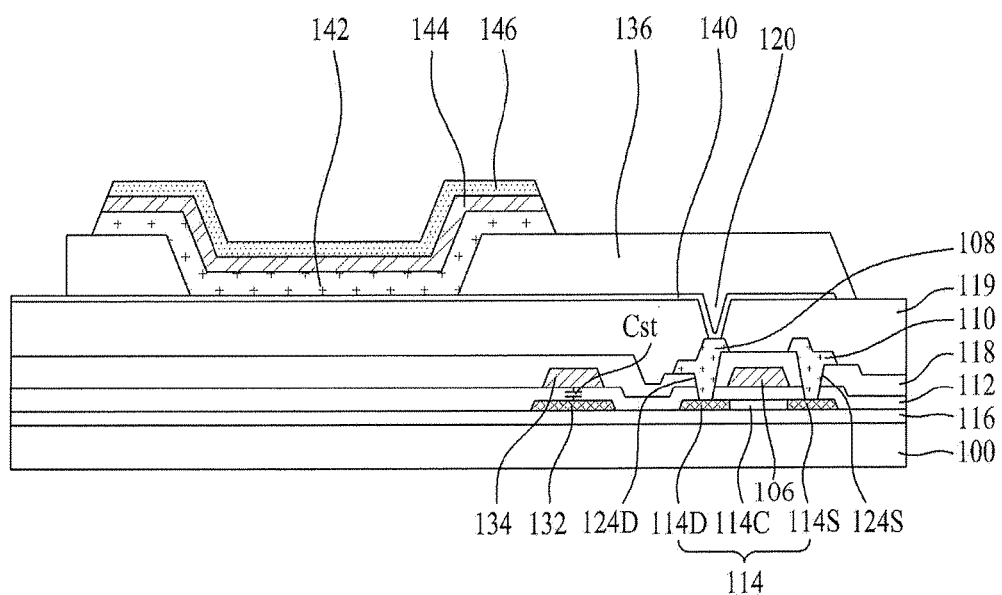

Referring to FIG. 4I, the organic EML 142, the second electrode 144, and the first passivation layer 146 are formed on the first electrode 140.

In particular, the organic EML 142 is formed by sequentially forming an HIL, an HTL, an EML, an ETL, and an EIL using a shadow mask. Sequentially, the second electrode 144 formed of a material having high reflexivity, such as Al and the first passivation layer 146 are formed on the substrate 100 on which the organic EML 142 is formed, using the same shadow mask as that used to form the organic EML 142. The shadow mask has an opening through which a deposition material passes when deposition is performed and a shielding region that shields the deposition material when the deposition is performed. Through the opening of the shadow mask, the organic EML 142, the second electrode 144, and the first passivation layer 146 are sequentially stacked on the first electrode 140.

The first passivation layer 146 is formed of an organic compound having at least one of the structural formulae described in Formula 1 below.

<Formula 1>

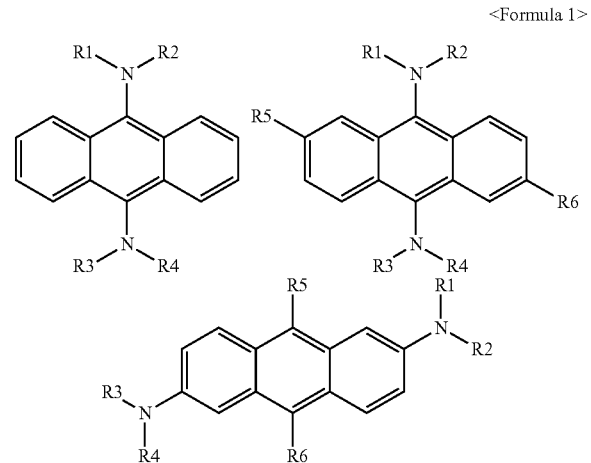

In Formula 1, R1, R2, R3, R4, R5, and R6 are each independently selected from substituted or unsubstituted $C_6$-$C_{40}$ aromatic groups. The organic compound having at least one of the structural formulae described in Formula 1 is selected from HM-01 through HM-65, and formulae of HM-01 through HM-65 are the same as described above.

When the organic compound having at least one of the structural formulae of Formula 1 is used to form the first passivation layer 146, ash is not generated when the first passivation layer 146 is formed by deposition. Accordingly, permeation of moisture and oxygen from the outside may be prevented. That is, when a passivation layer covering a conventional organic light emitting diode is formed, ash is generated and is also deposited in the passivation layer and thus the passivation layer is not uniformly formed. Consequently, a gap is formed between a first electrode and the passivation layer due to non-uniform formation of the passivation layer and thus moisture or oxygen permeates the gap therebetween. In the embodiments, however, ash is not generated when the first passivation layer 146 is formed and thus the first passivation layer 146 may be uniformly and smoothly formed. Thus, the first passivation layer 146 is formed on the second electrode 144 to be uniform and smooth. In addition, since the first passivation layer 146 is uniformly and smoothly formed on the second electrode 144, the second passivation layer 148 is also uniformly formed on the first passivation layer 146.

In other words, no gap is formed between the second electrode 144 and the first passivation layer 146 and no gap is formed between the first passivation layer 146 and the second passivation layer 148. Thus, permeation of moisture or oxygen between the second electrode 144 and the first passivation layer 146 and between the first passivation layer 146 and the second passivation layer 148 may be prevented. In addition, the first and second passivation layers 146 and 148 are smoothly formed without a gap therebetween and thus no gap is formed between the second passivation layer 148 and the encapsulation substrate 150 that are adhered to each other by the adhesive film 152.

As described above, by smoothly and uniformly forming the first passivation layer 146, no gap is formed among the second passivation layer 148, the adhesive film 152, and the encapsulation substrate 150 that are sequentially stacked on the first passivation layer 146. Consequently, damage to the organic light emitting diode by moisture or oxygen may be prevented, which results in increased lifespan of the organic light emitting diode.

Meanwhile, as illustrated in FIG. 2, when the first passivation layer 146 is formed in the same pattern as that used to form the organic EML 142 and the second electrode 144, the first passivation layer 146 and the second electrode 144 may be formed using the same shadow mask. In another embodiment, as illustrated in FIG. 3, when the first passivation layer 246 is entirely formed on the organic EML 142 and the second electrode 144 to cover side surfaces of the organic EML 142 and the second electrode 144, the first passivation layer 246 may be formed using a shadow mask having a wider opening than that of a shadow mask used to form the organic EML 142 and the second electrode 144.

Figure 4J:
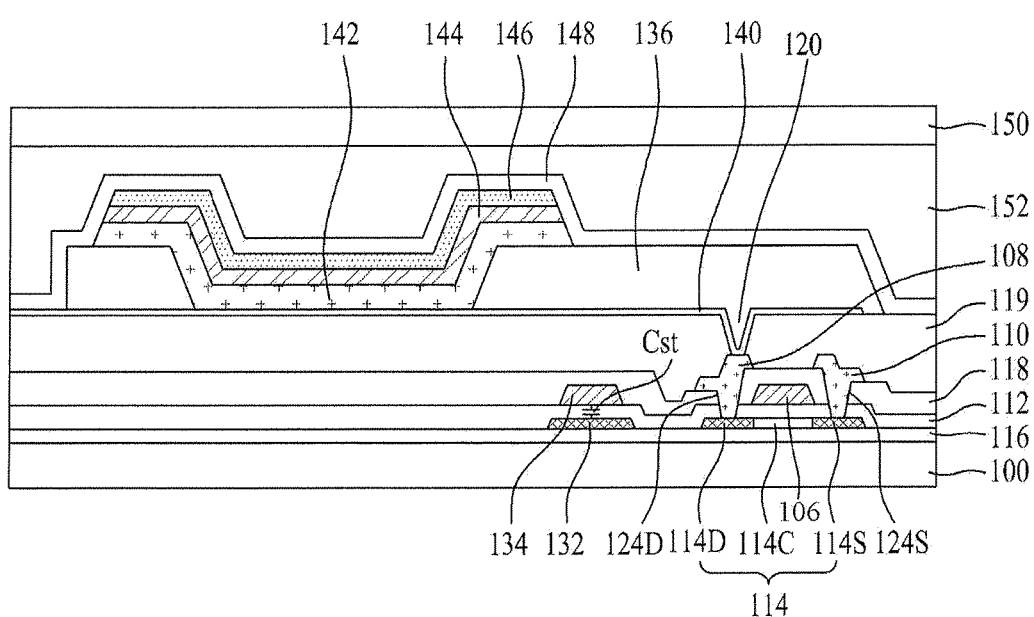

Referring to FIG. 4J, silicon oxide or silicon nitride is deposited over the light emitting diode substrate 100 on which the first passivation layer 146 is formed, to form the second passivation layer 148. In this regard, the second passivation layer 148 is entirely formed by deposition without using a mask for deposition. Subsequently, the adhesive film 152 is attached to a front surface of the second passivation layer 148 or a rear surface of the encapsulation substrate 150, and then the light emitting diode array substrate including the organic light emitting diode is adhered to the encapsulation substrate 150 by the adhesive film 152.

Figure 5:
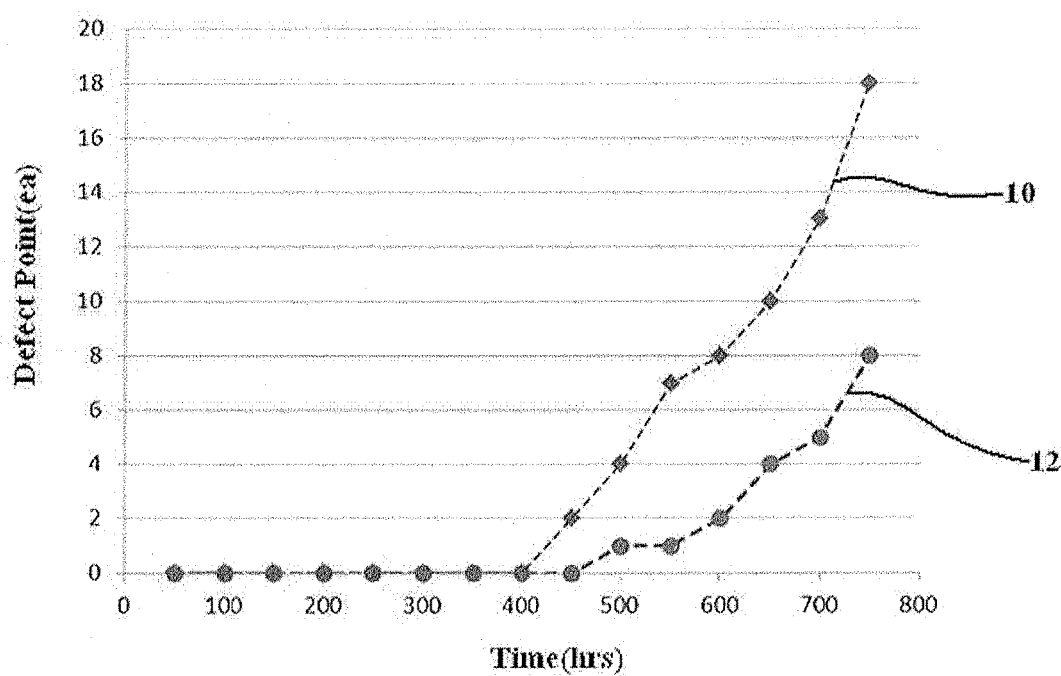
FIG. 5 is a graph showing comparison results between lifespan of an organic light emitting diode when a protective layer formed of $Alq_3$ is used and lifespan of an organic light emitting diode when the first protective layer according to the present invention is used.

FIG. 5 is a graph showing comparison results between lifespan of an organic light emitting diode when a passivation layer formed of $Alq_3$ is used and lifespan of an organic light emitting diode when the first passivation layer according to the present invention is used.

In FIG. 5, the x axis denotes lifespan (time (hrs)) of an organic light emitting diode and the y axis denotes the number of defect points. The experimental data shown in FIG. 5 were obtained under high temperature and high humidity conditions, i.e., 85° C. and 85%.

A first curve 10 shows the lifespan of an organic light emitting diode when the passivation layer of $Alq_3$ is used, and a second curve 12 shows the lifespan of an organic light emitting diode when the first passivation layer according to the present invention is used.

As illustrated in FIG. 5, the first curve 10 exhibits a more rapid rate of increase in the number of defect points than in the second curve 12 and exhibits a shorter lifespan under high temperature and high humidity conditions than in the second curve 12.

As described above, when the first passivation layer according to the present invention is used, permeation of moisture or oxygen may be prevented and thus an increase rate of the number of defect points is slow and lifespan is long under high temperature and high humidity conditions.

As is apparent from the above description, in an organic light emitting display panel and a method of manufacturing the same, according to the present invention, a first passivation layer formed of an organic compound having at least one of the structural formulae described in Formula 1 may be formed to cover an organic light emitting diode without generation of ash during deposition.

Accordingly, the first passivation layer is uniformly and smoothly formed on the organic light emitting diode without a gap between the organic light emitting diode and the first passivation layer, which may be formed by non-uniform formation of a conventional passivation layer due to generated ash, and thus an adhesive strength between the organic light emitting diode and a first electrode is increased. Accordingly, permeation of moisture or oxygen from the outside may be prevented.

Since permeation of moisture or oxygen is prevented, the organic light emitting diode may have increased lifespan.

In addition, the first passivation layer according to the present invention may be formed of an organic material which is less expensive than a material of a passivation layer of a conventional organic light emitting diode, such as DNTPD and IDE406, and thus manufacturing costs of the organic light emitting display panel may be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
   a driving thin film transistor on a substrate, the driving thin film transistor including an active layer having a channel region and source and drain regions on the substrate, a gate insulating layer on the substrate with the active layer, a gate electrode on the gate insulating layer and over the channel region, an interlayer insulating layer on the gate insulating layer with the gate electrode, and source and drain electrodes on the interlayer insulating layer to contact with the source and drain regions;
   a storage capacitor on the substrate, the storage capacitor including a lower storage electrode, an upper storage electrode and the gate insulating layer between the lower storage electrode and the upper storage electrode;
   an organic light emitting diode comprising a first electrode connected to the driving thin film transistor, an organic emission layer on the first electrode, and a second electrode on the organic emission layer;
   a first passivation layer formed on the second electrode of the organic light emitting diode; and
   a second passivation layer formed on the first passivation layer;
   a light emitting diode array substrate including the driving thin film transistor, the organic light emitting diode, the first passivation and second passivation layers; and
   an encapsulation substrate adhered to the second passivation layer of the light emitting diode array substrate by an adhesive film,
   wherein the first passivation layer is formed of an organic compound, having at least one of the structural formulae described in Formula 1 below:

<Formula 1>

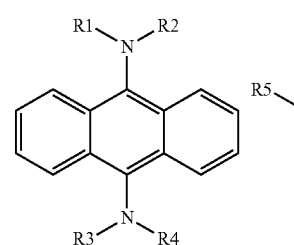
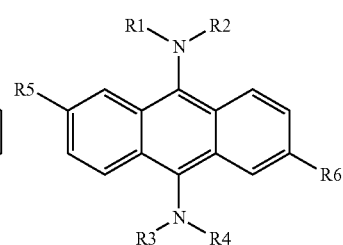

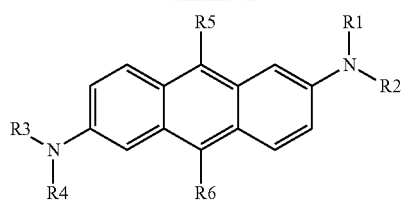

wherein R1, R2, R3, R4, R5, and R6 are each independently selected from substituted or unsubstituted $C_6$-$C_{40}$ aromatic groups.

2. The organic light emitting display according to claim 1, wherein the first passivation layer is entirely on the organic emission layer and the second electrode to cover side surfaces of the organic emission layer and the second electrode.

3. The organic light emitting display according to claim 1, wherein the organic compound having at least one of the structural formulae of Formula 1 is selected from HM-01 through HM-65:

HM-01

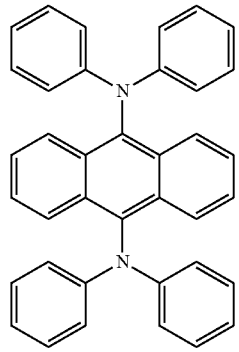

HM-02

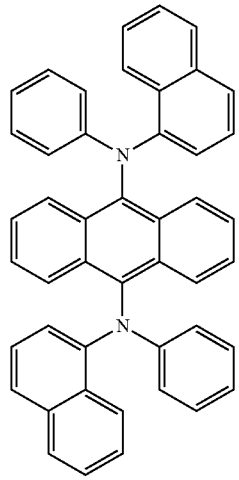

HM-03
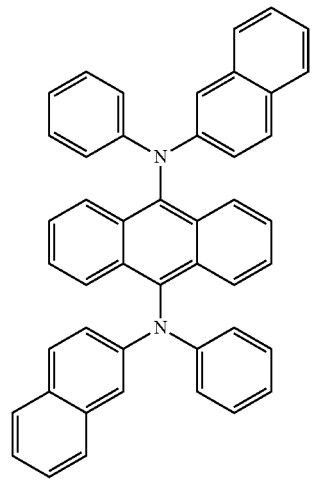
HM-06
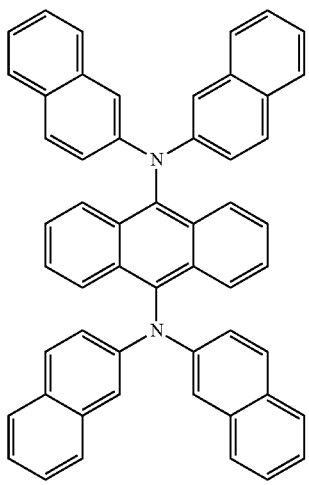
HM-04
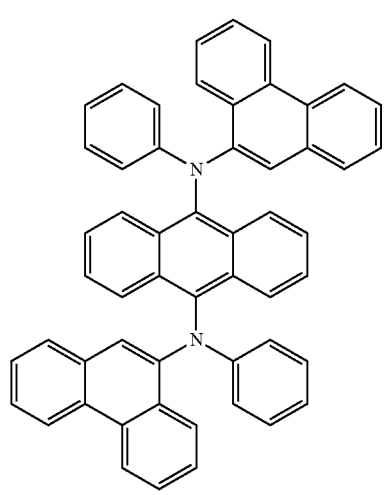
HM-07
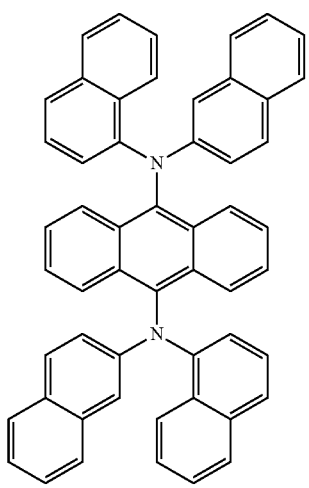
HM-05
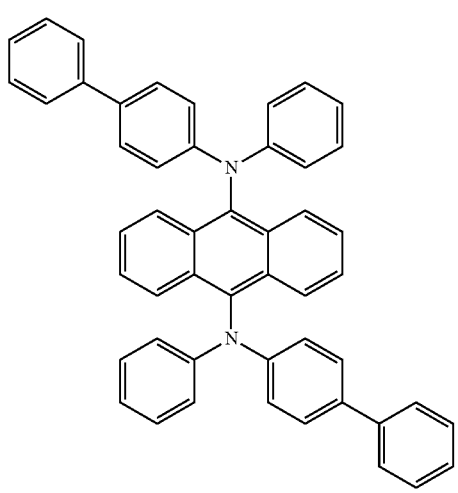
HM-08
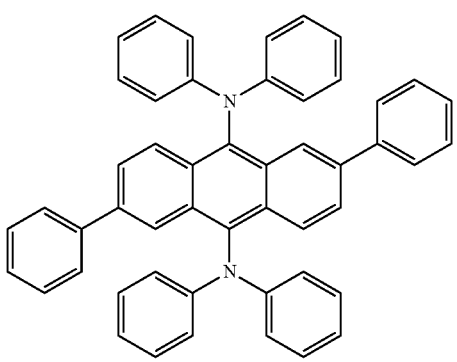

HM-09
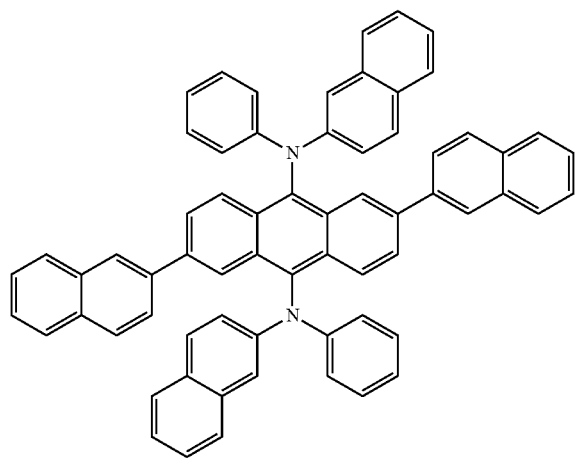
HM-10
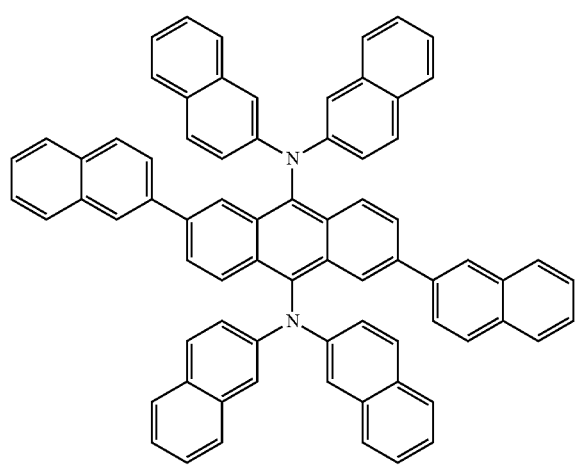
HM-11
HM-12
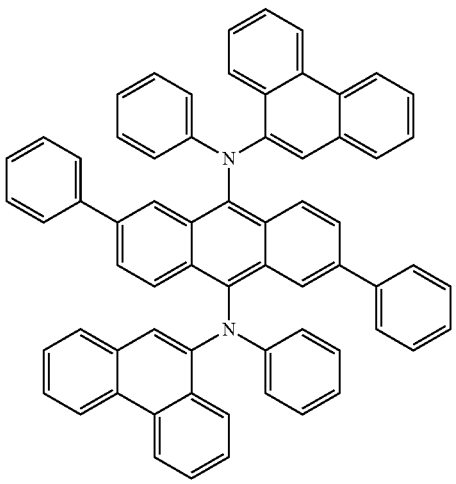
HM-13
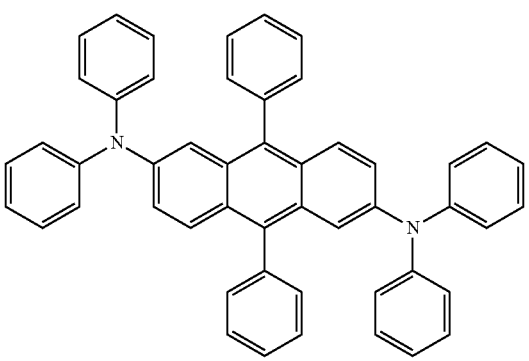
HM-14
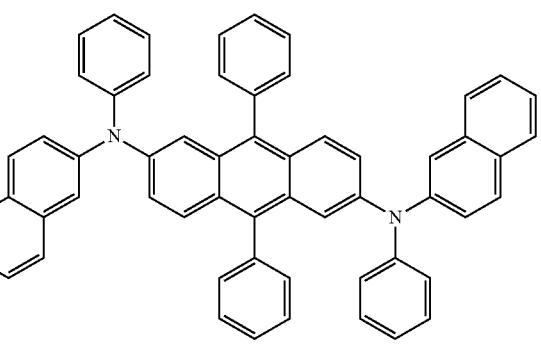
HM-15
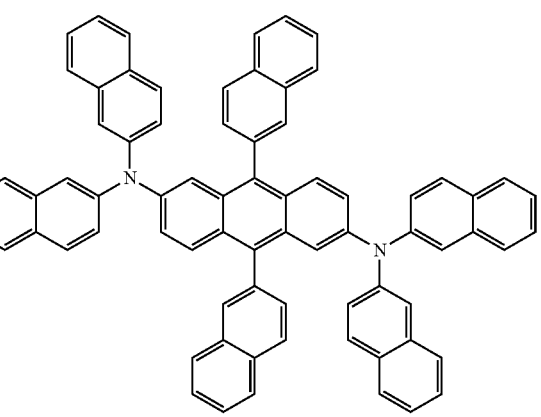

HM-16
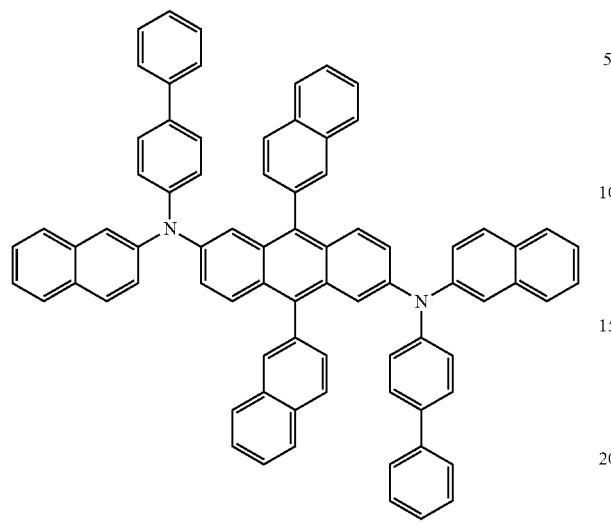
HM-17
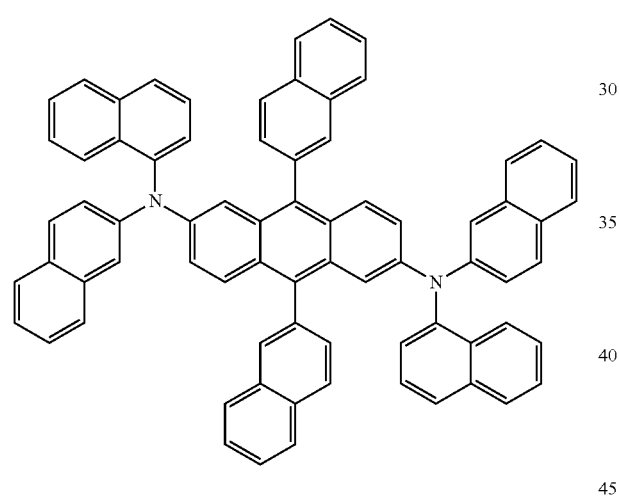
HM-18
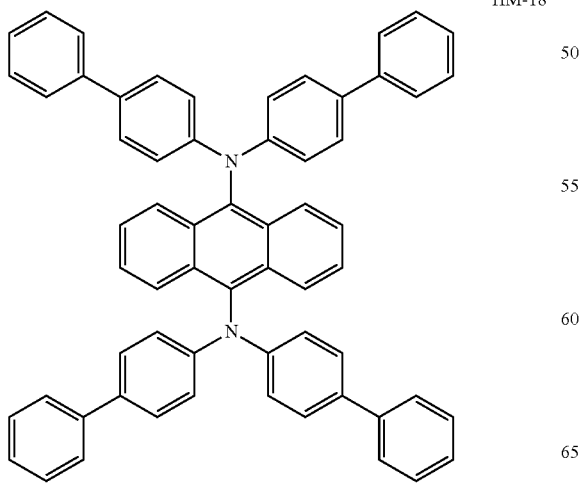
HM-19
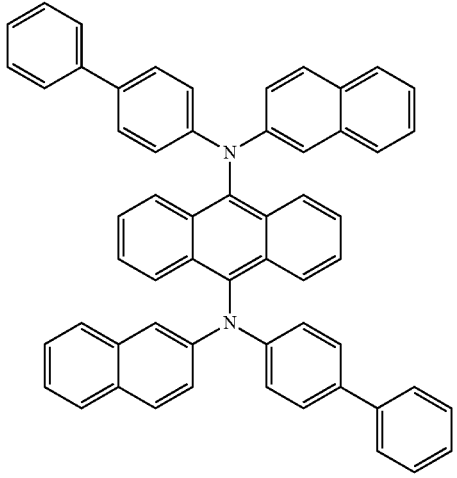
HM-20
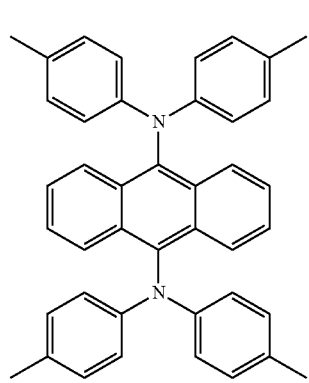
HM-21
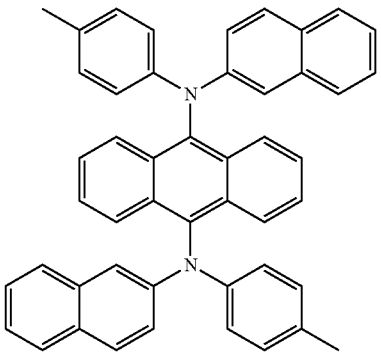

HM-22
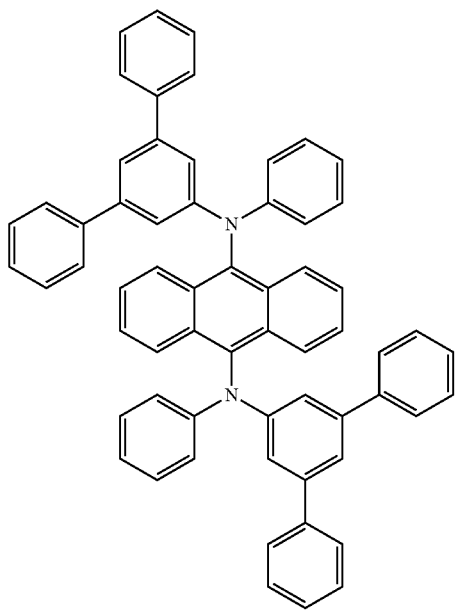
HM-23
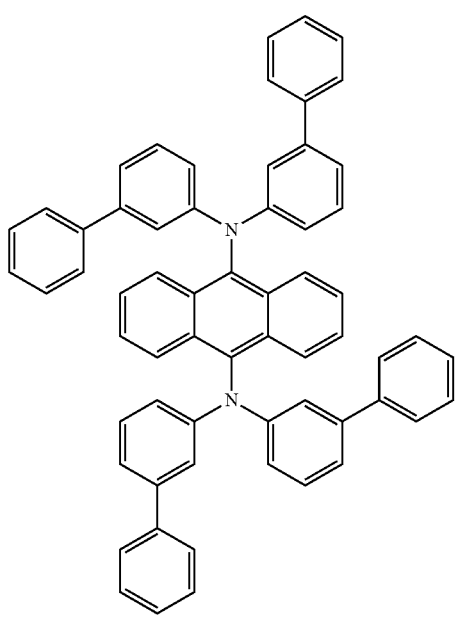
HM-24
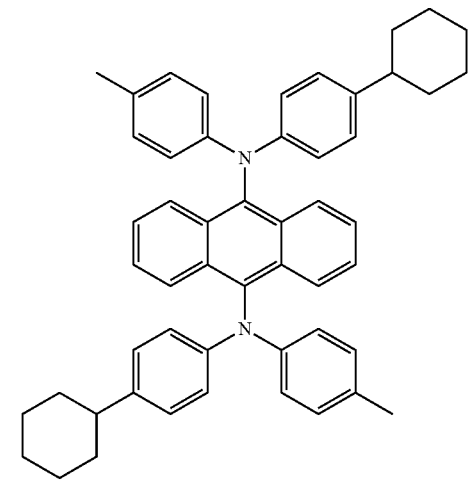
HM-25
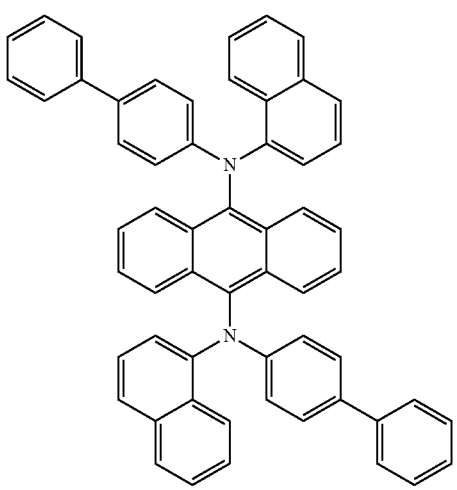
HM-26
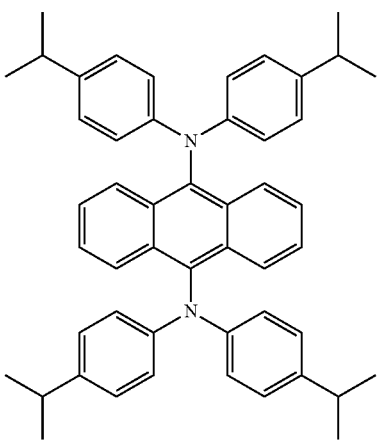

HM-27
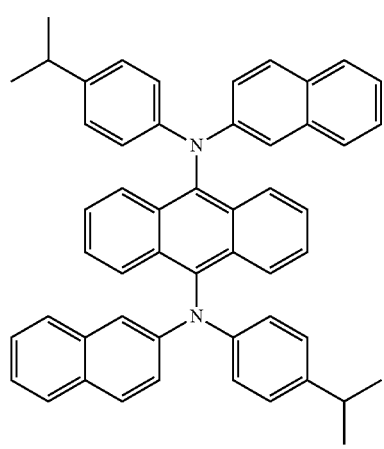
HM-30
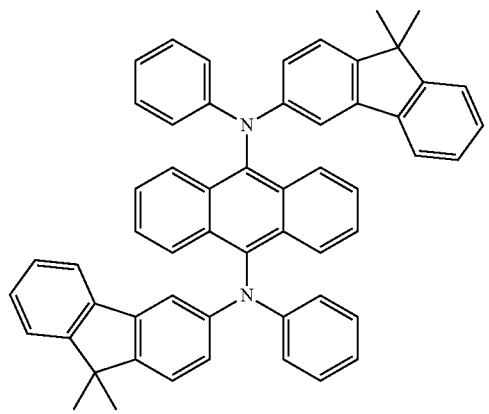
HM-28
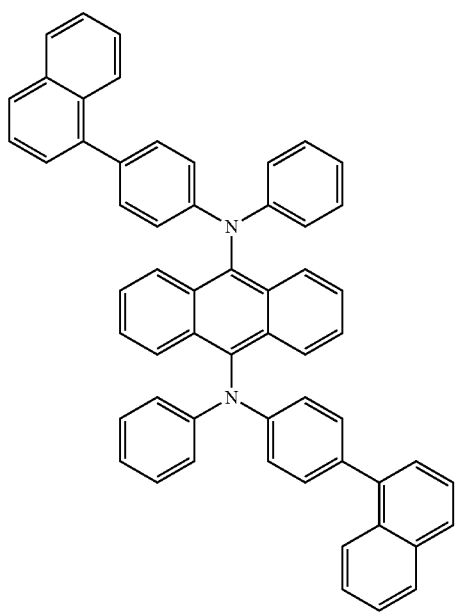
HM-31
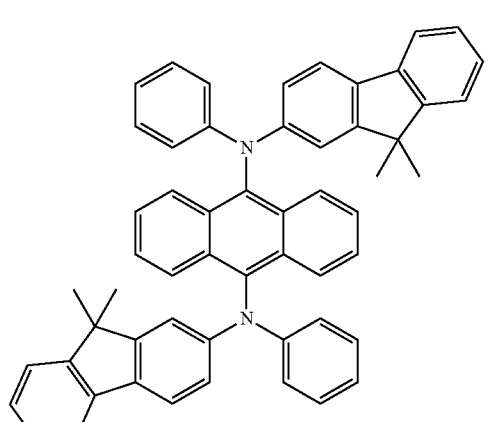
HM-29
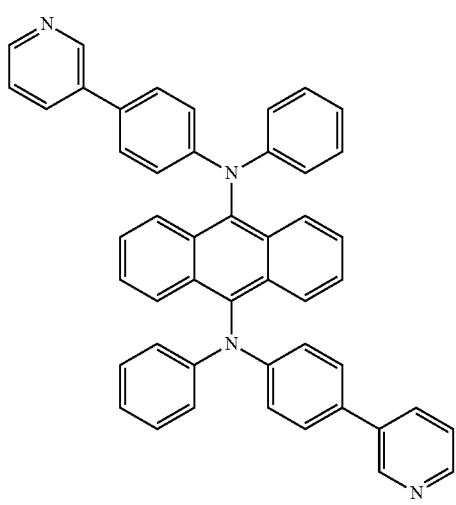
HM-32
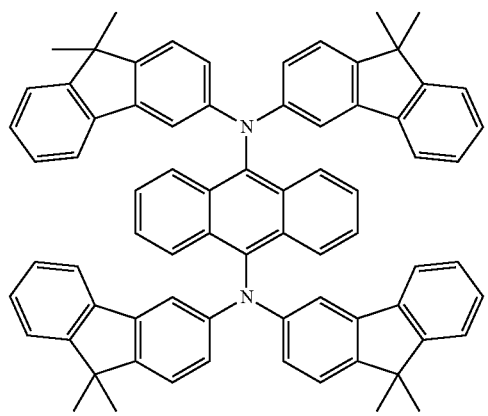

HM-33
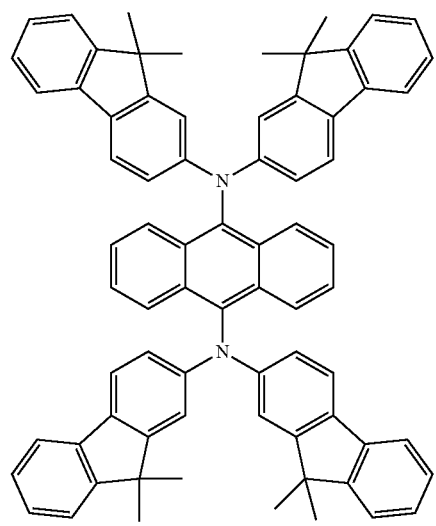
HM-36
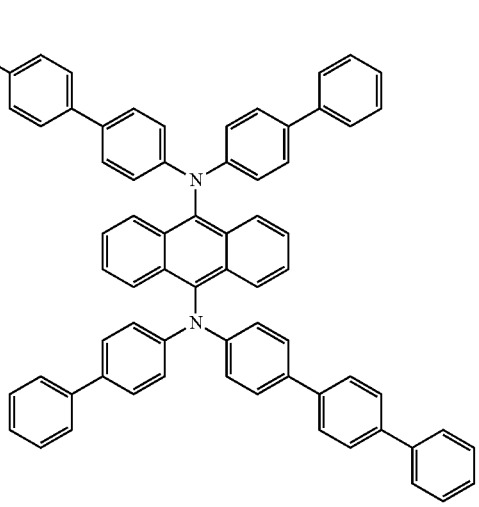
HM-34
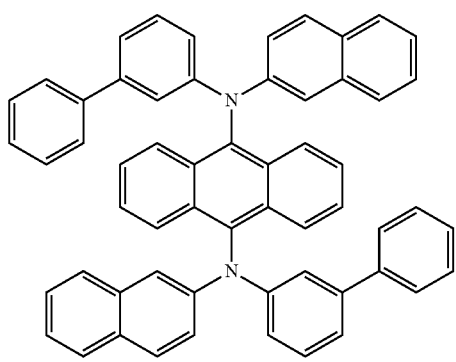
HM-37
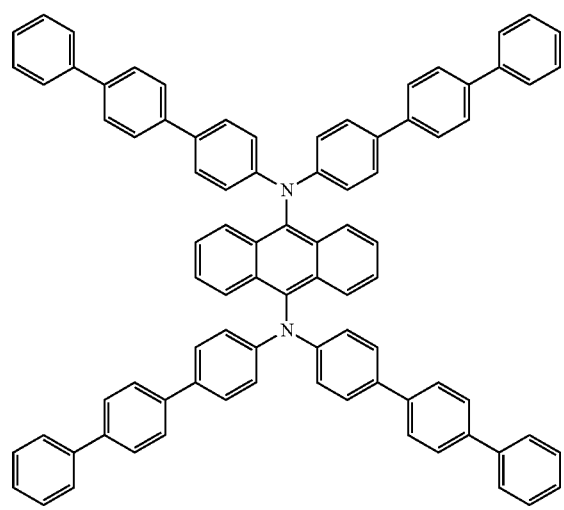
HM-35
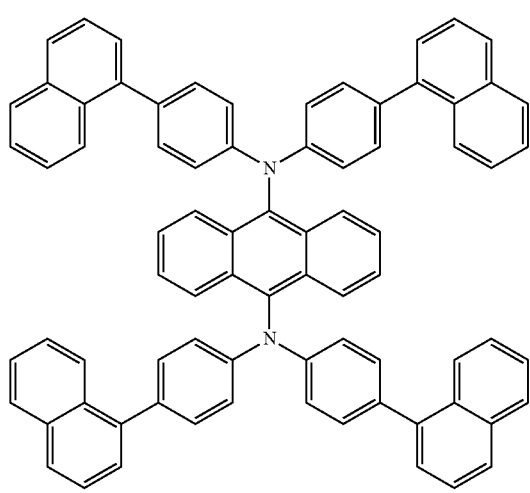
HM-38
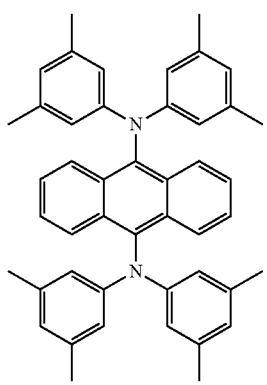

-continued
HM-39
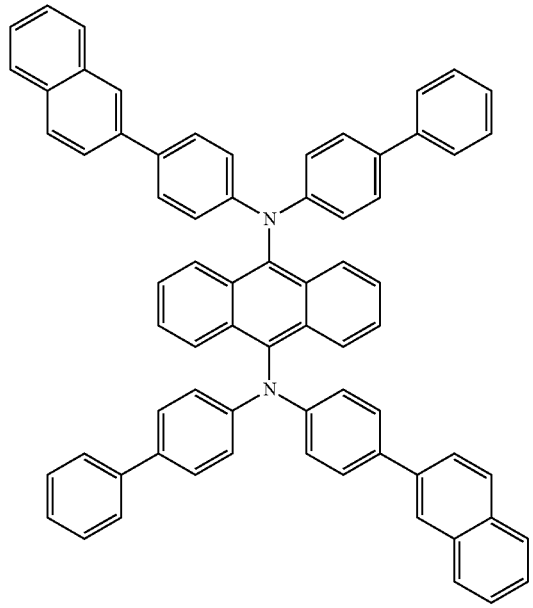
HM-40
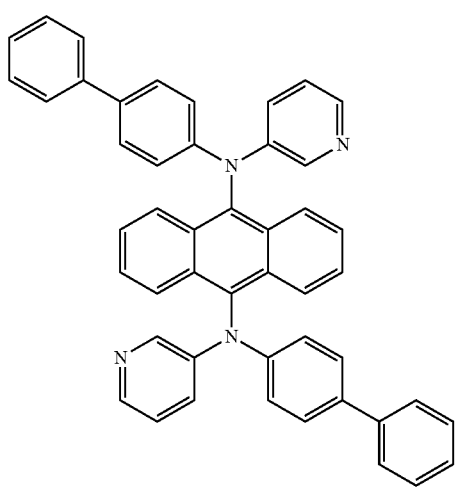
HM-41
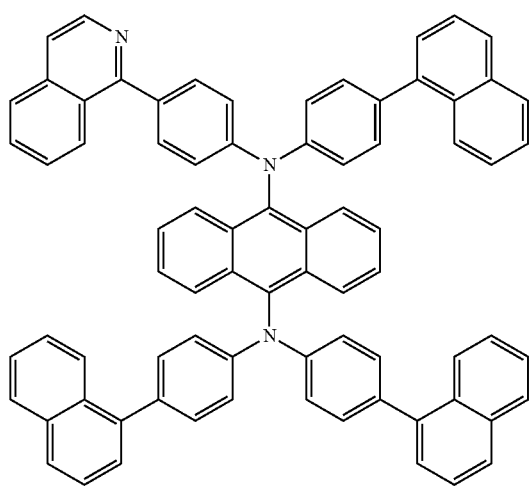
-continued
HM-42
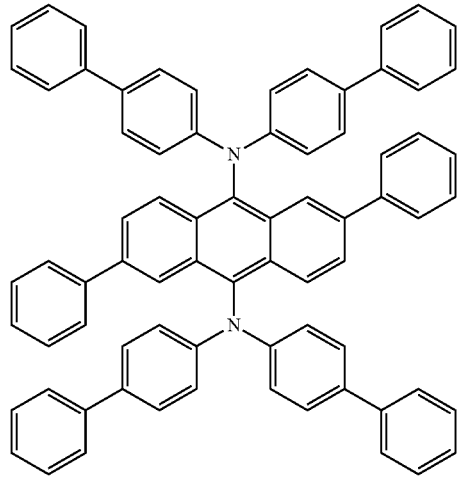
HM-43
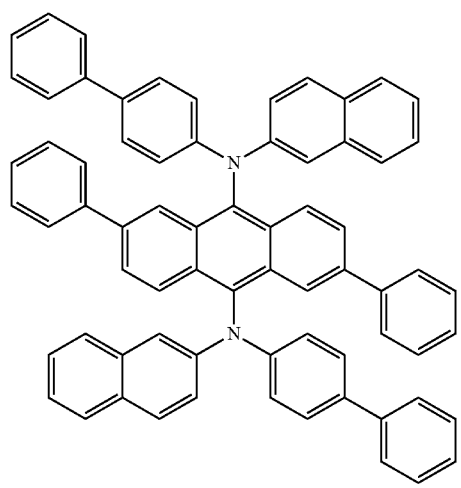
HM-44
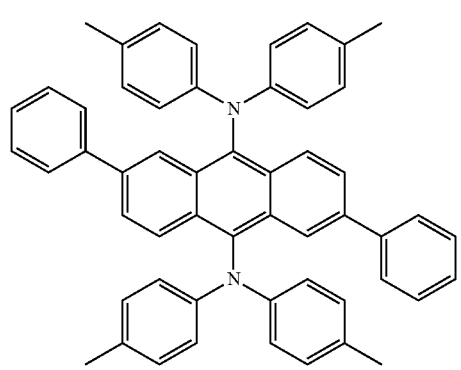

HM-45
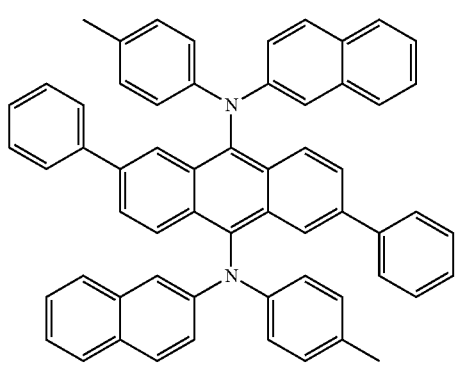
HM-46
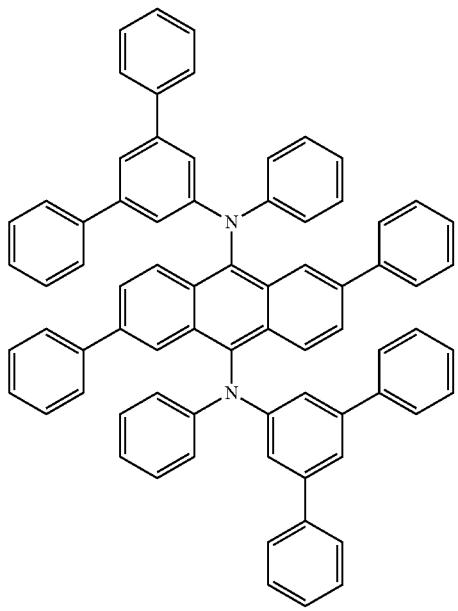
HM-47
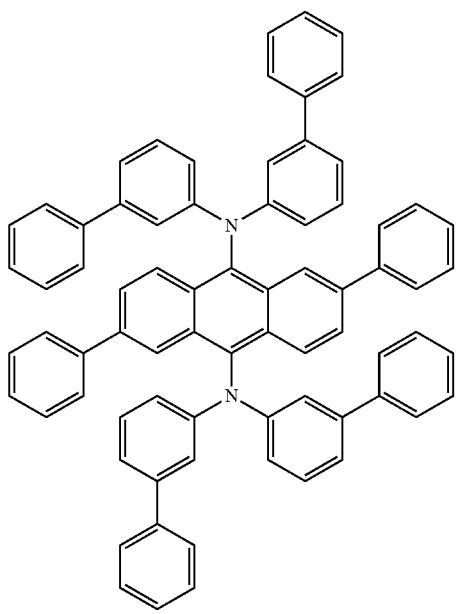
HM-48
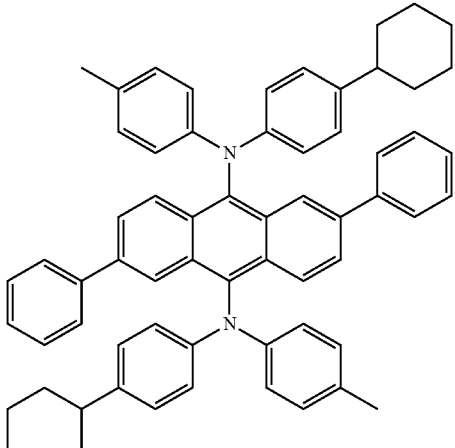
HM-49
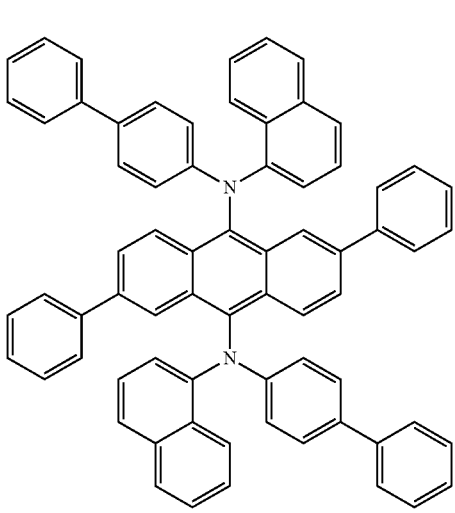
HM-50
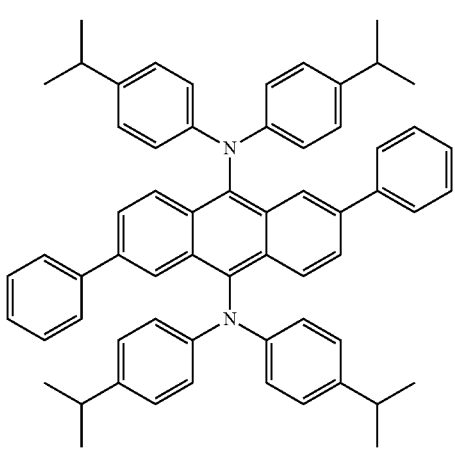

HM-51
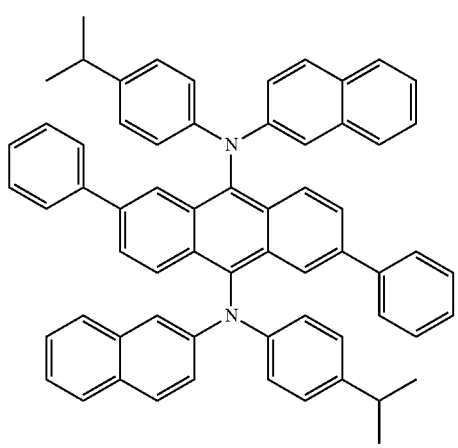
HM-52
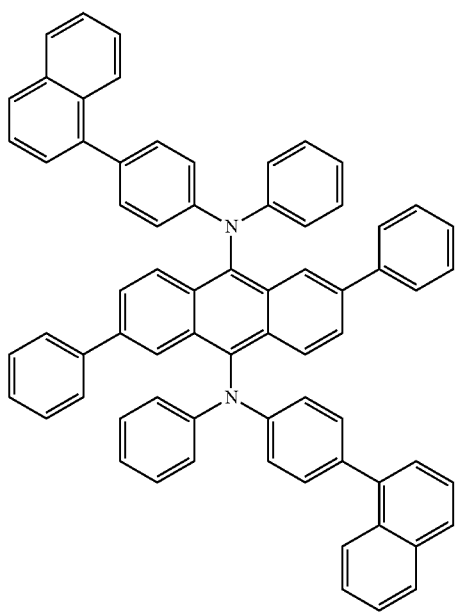
HM-53
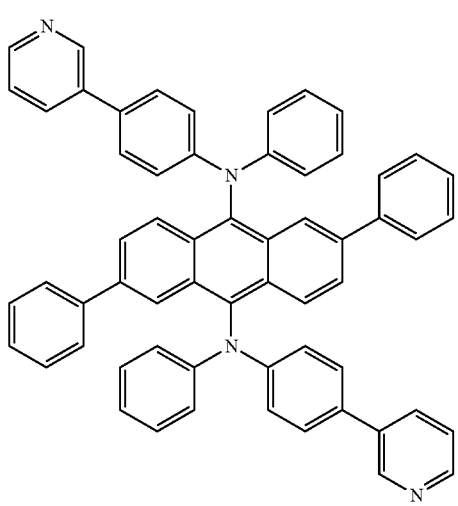
HM-54
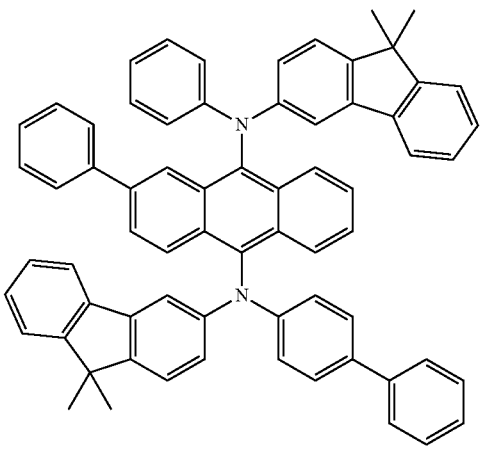
HM-55
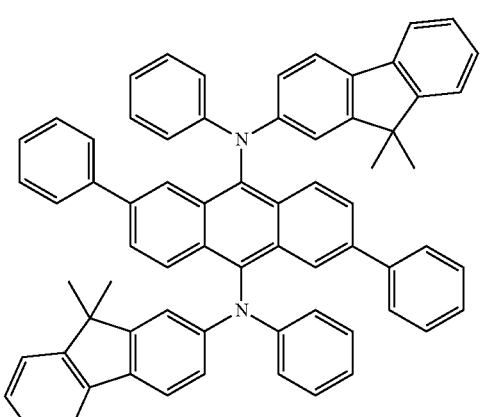
HM-56
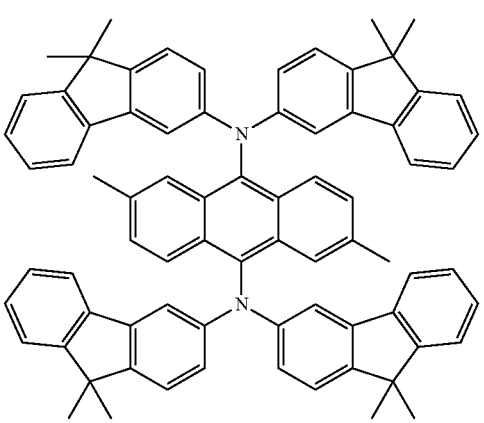

HM-57
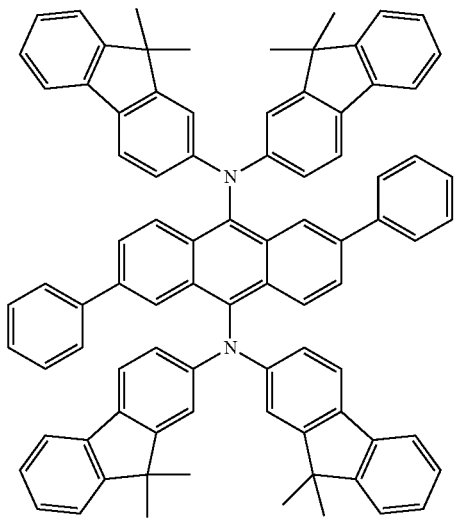
HM-58
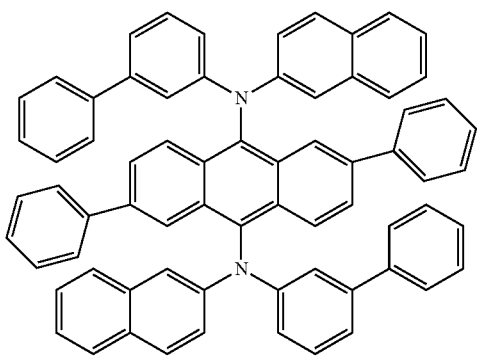
HM-59
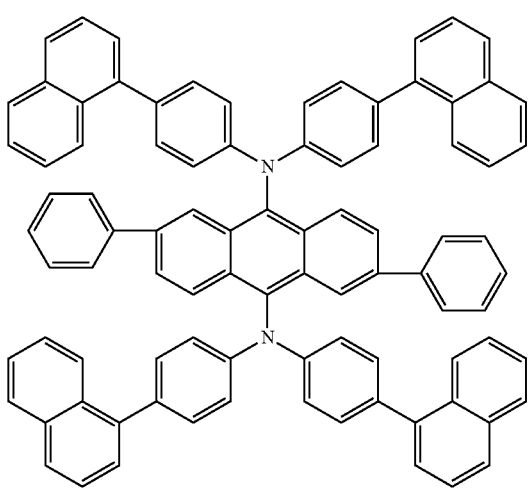
HM-60
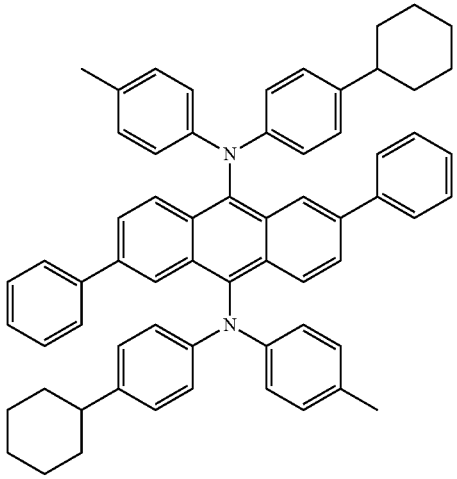
HM-61
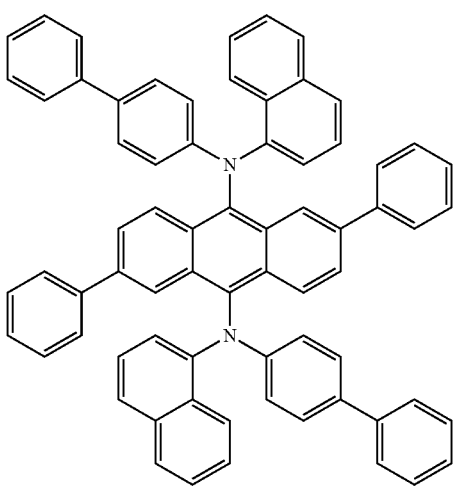
HM-62
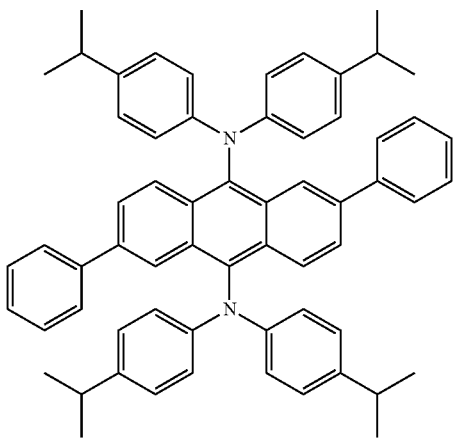

-continued

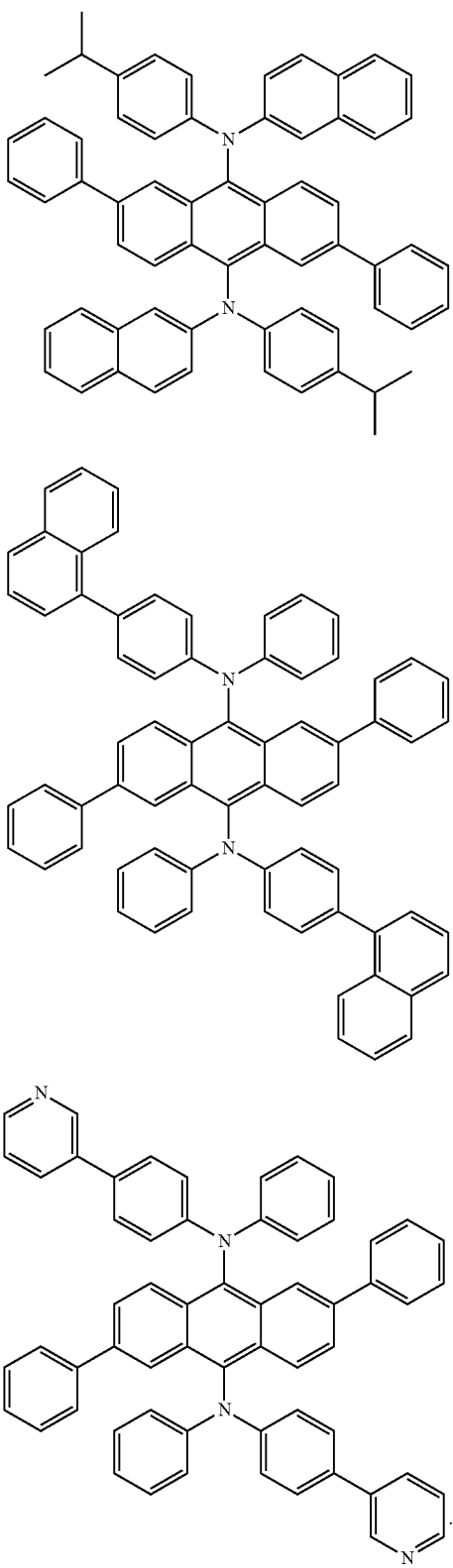

4. A method of manufacturing an organic light emitting display, the method comprising:
forming a driving thin film transistor on a substrate, the driving thin film transistor including an active layer having a channel region and source and drain regions on the substrate, a gate insulating layer on the substrate with the active layer, a gate electrode on the gate insulating layer and over the channel region, an interlayer insulating layer on the gate insulating layer with the gate electrode, and source and drain electrodes on the interlayer insulating layer to contact with the source and drain regions;
forming a storage capacitor on the substrate, the storage capacitor including a lower storage electrode, an upper storage electrode and the gate insulating layer between the lower storage electrode and the upper storage electrode;
forming a first electrode to be connected to the driving thin film transistor;
forming an organic emission layer and a second electrode on the first electrode;
forming a first passivation layer on the second electrode;
forming a second passivation layer over the substrate with the first passivation layer formed thereon; and
adhering a light emitting diode array substrate including thereon the driving thin film transistor, the first electrode, the organic emission layer, the second electrode, the first passivation layer, and the second passivation layer to an encapsulation substrate by an adhesive film,
wherein the first passivation layer is formed of an organic compound having at least one of the structural formulae described in Formula 1 below:

<Formula 1>

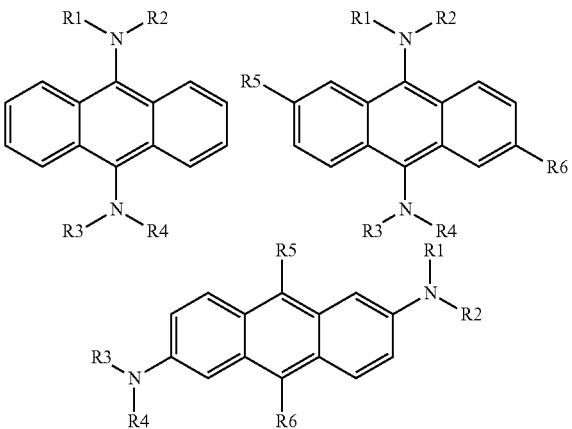

wherein R1, R2, R3, R4, R5, and R6 are each independently selected from substituted or unsubstituted $C_6$-$C_{40}$ aromatic groups.

5. The method according to claim 4, wherein the first passivation layer is formed over the second electrode.

6. The method according to claim 5, wherein the first passivation layer is formed by deposition using the same mask as that used to form the organic emission layer and the second electrode.

7. The method according to claim 4, wherein the first passivation layer is entirely formed on the organic emission layer and the second electrode to cover side surfaces of the organic emission layer and the second electrode.

8. The method according to claim 4, wherein the organic compound having at least one of the structural formulae of Formula 1 is selected from HM-01 through HM-65:

HM-01
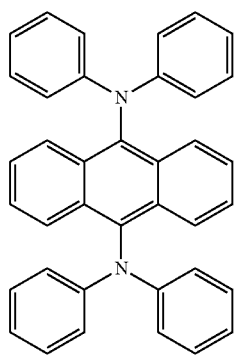
HM-02
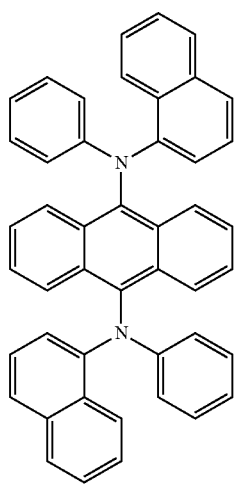
HM-03
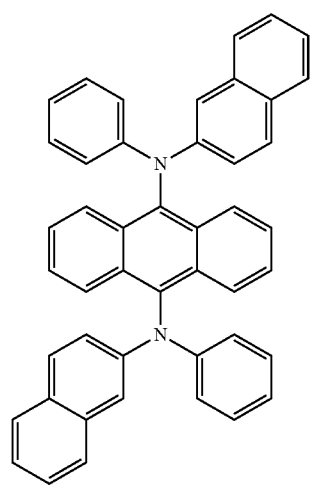
HM-04
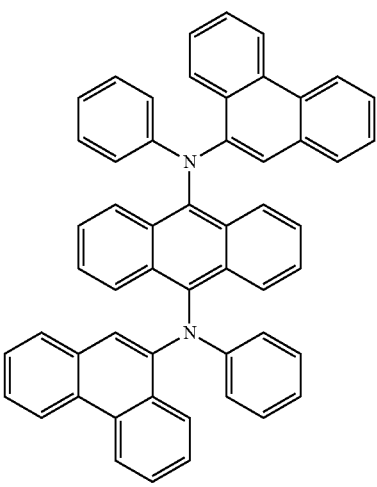
HM-05
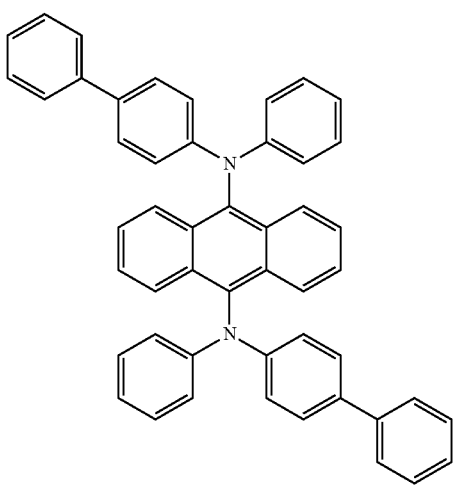
HM-06
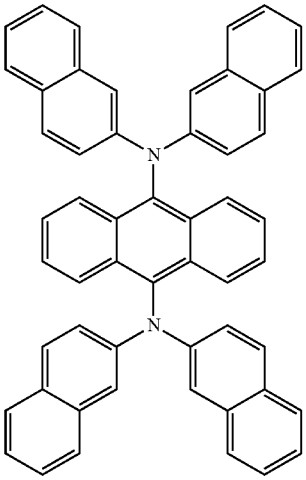

HM-07
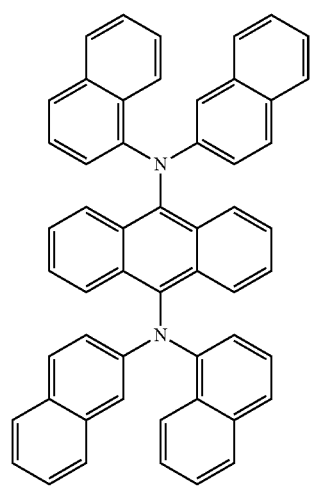
HM-08
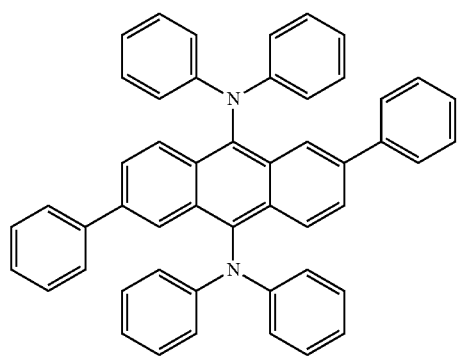
HM-09
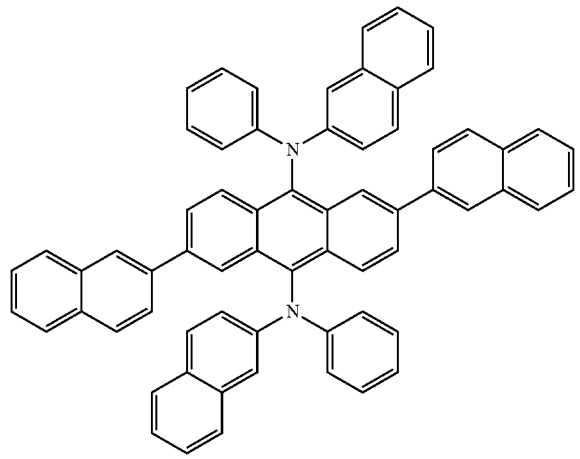
HM-10
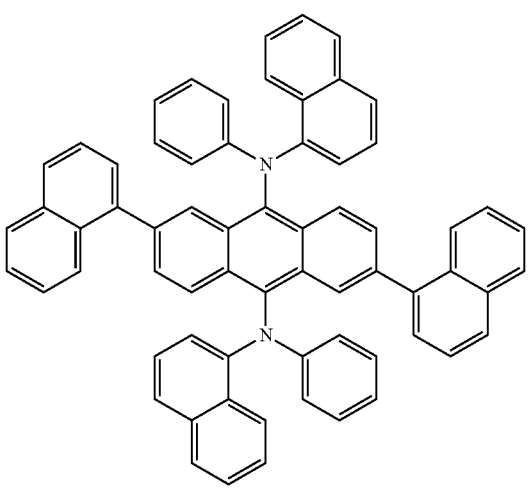
HM-11
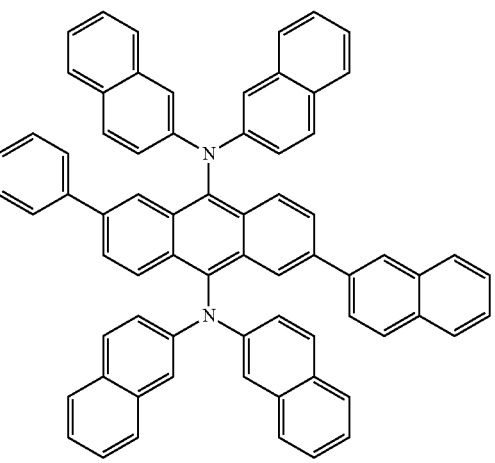
HM-12
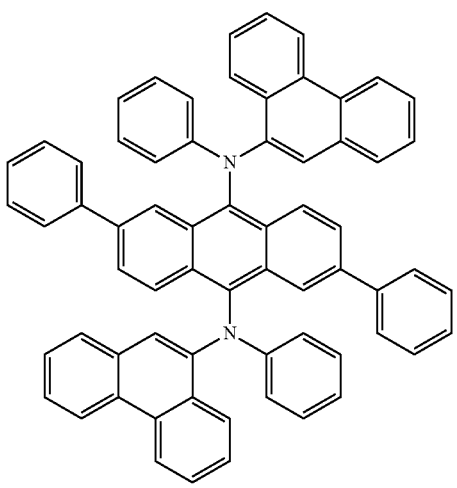

HM-13
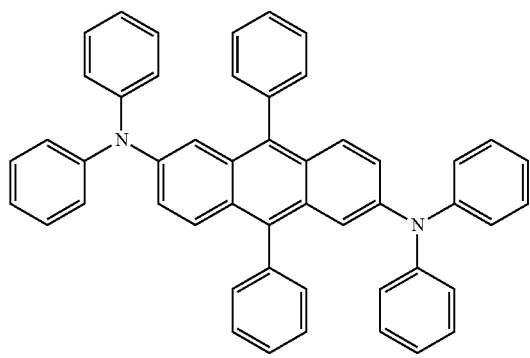
HM-14
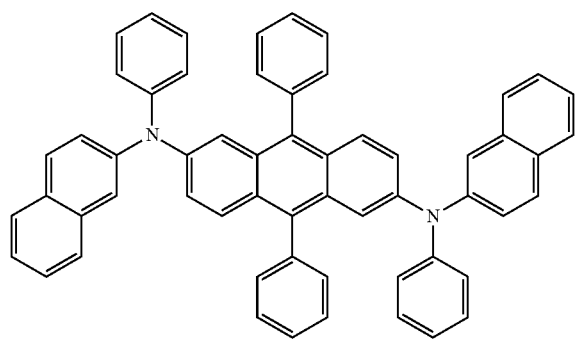
HM-15
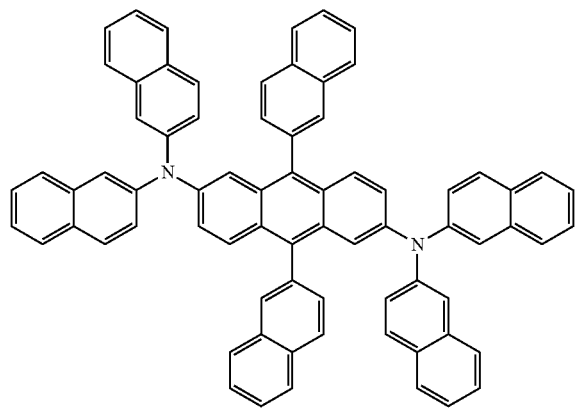
HM-16
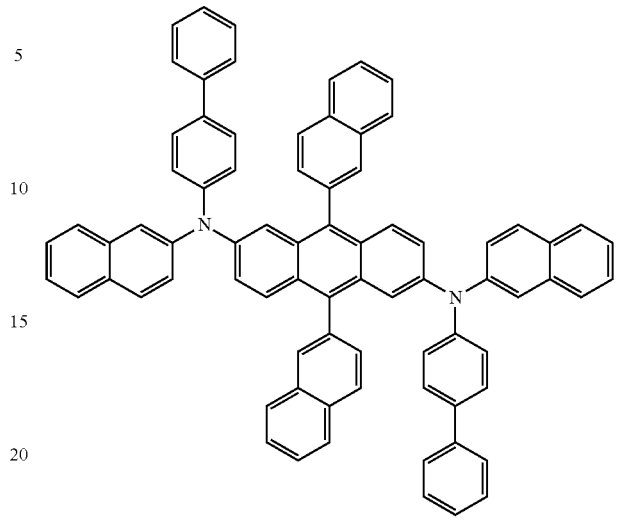
HM-17
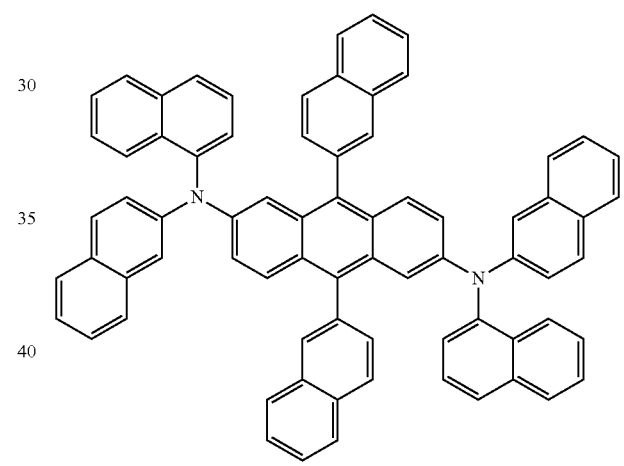
HM-18
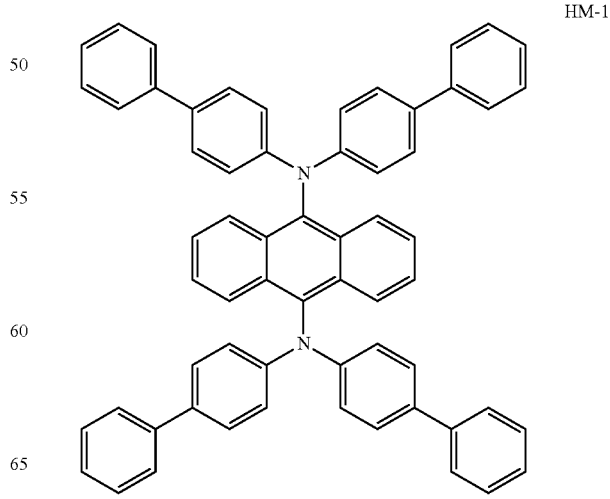

HM-19
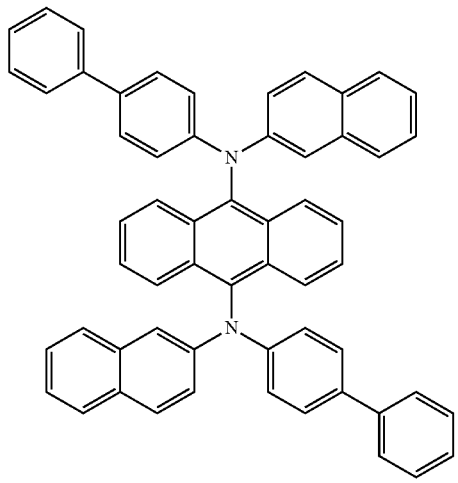
HM-20
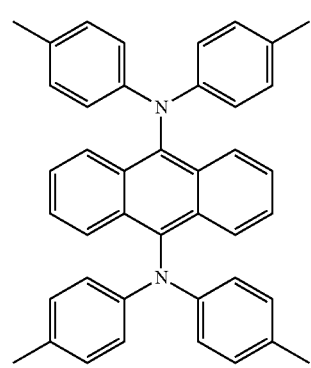
HM-21
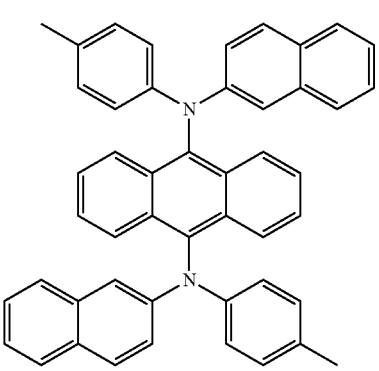
HM-22
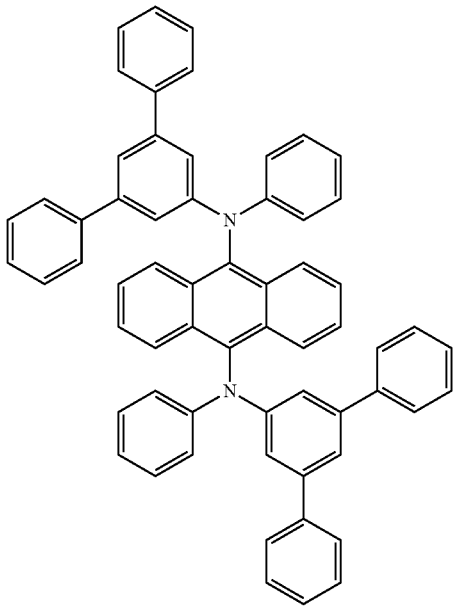
HM-23
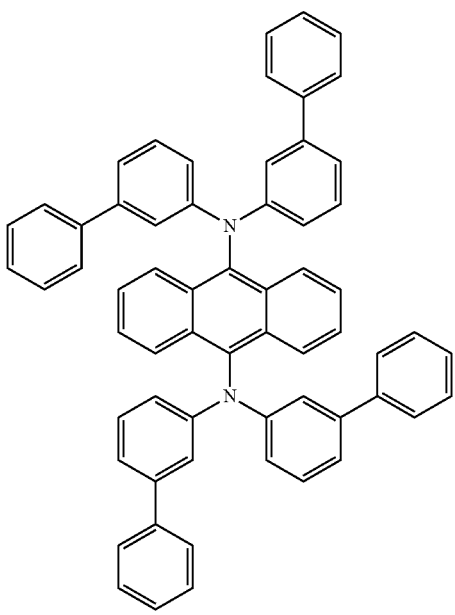

-continued
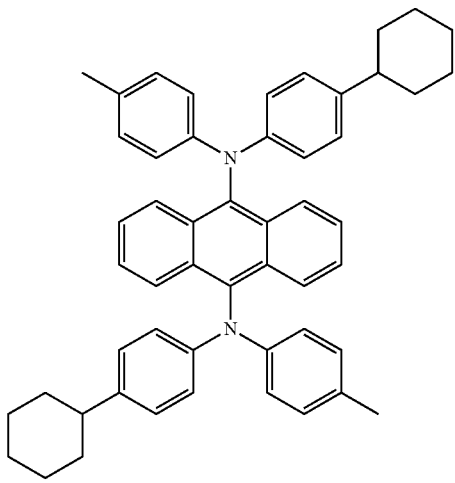
HM-24
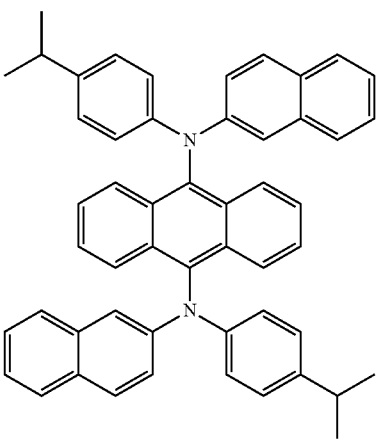
HM-27
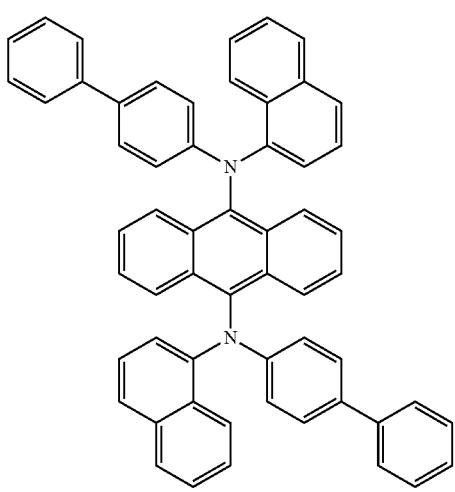
HM-25
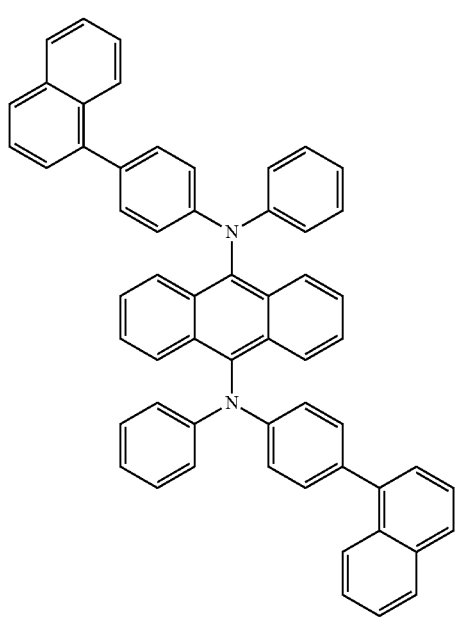
HM-28
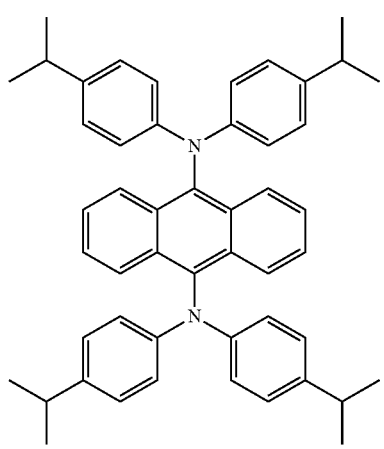
HM-26
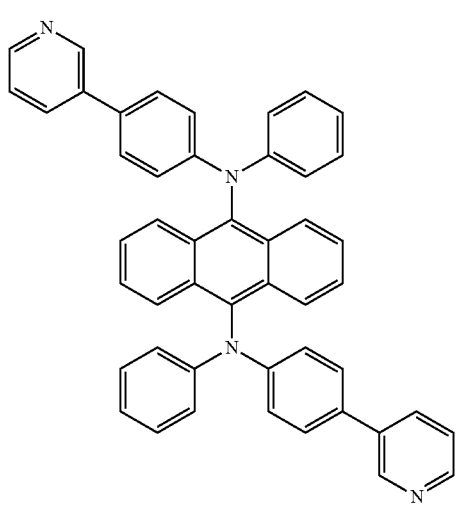
HM-29

HM-30
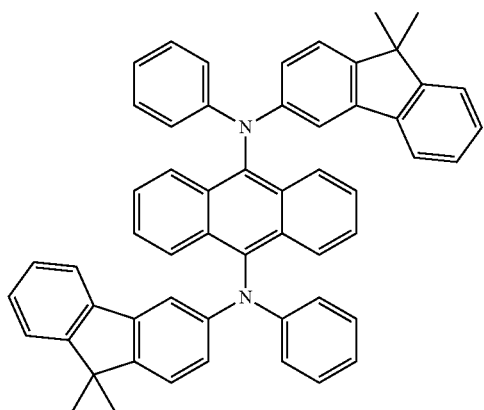
HM-31
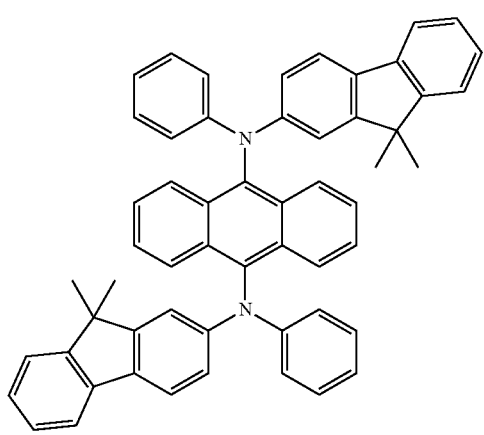
HM-32
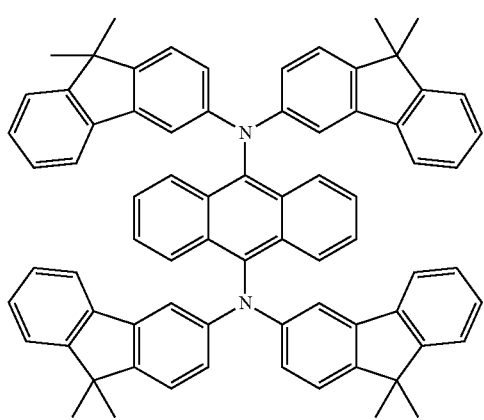
HM-33
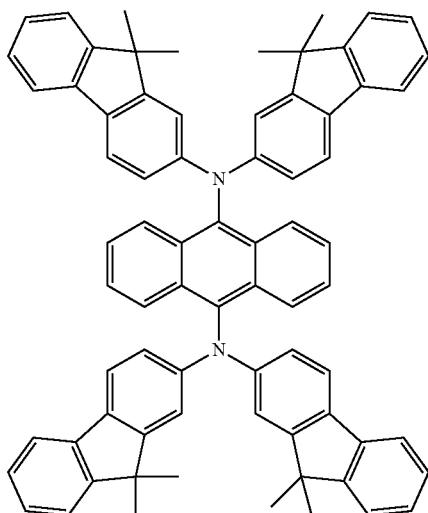
HM-34
HM-35
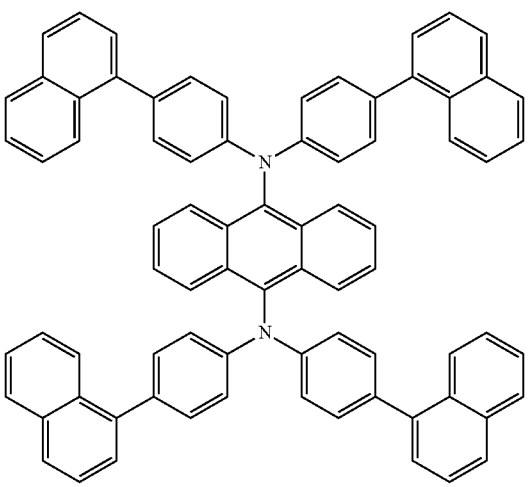

HM-36
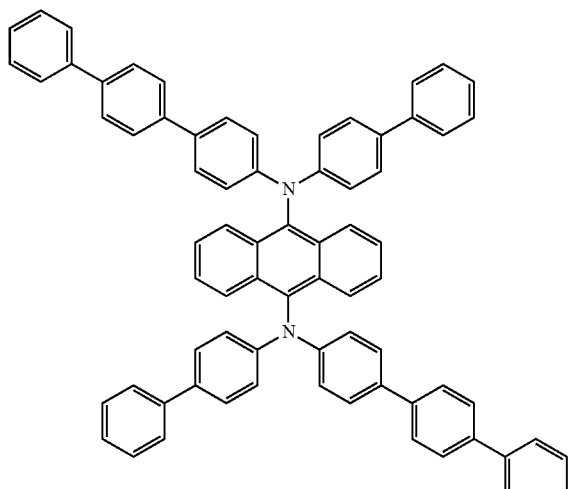
HM-37
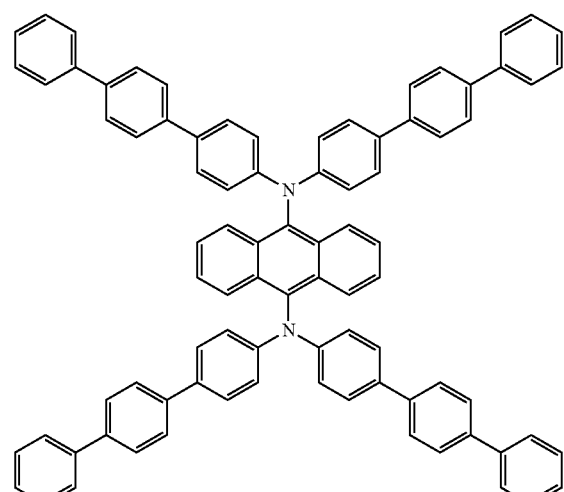
HM-38
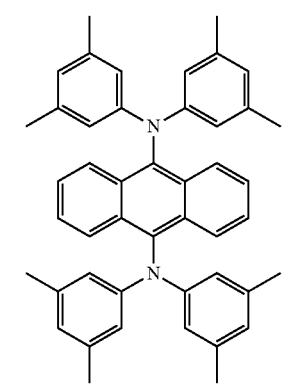
HM-39
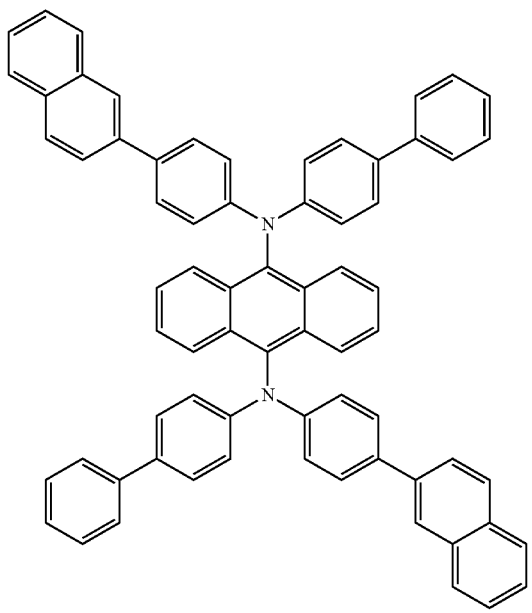
HM-40
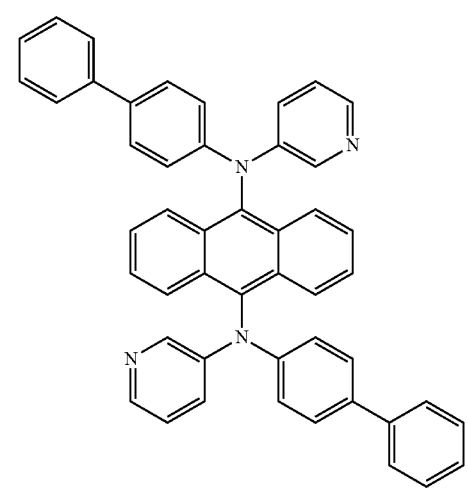
HM-41
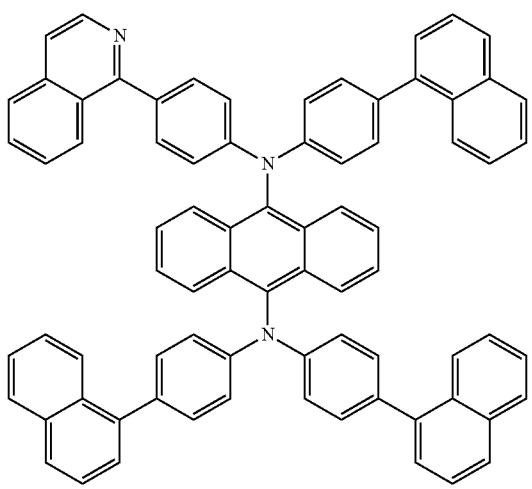

-continued
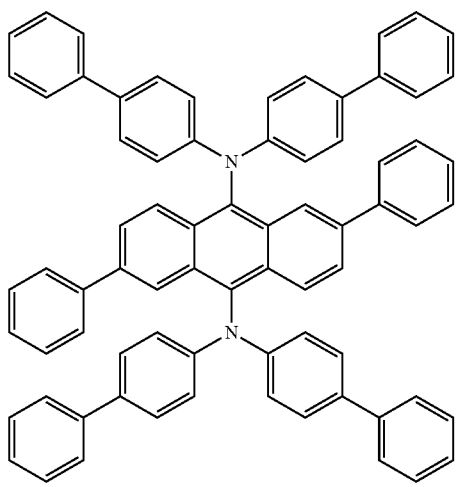
HM-42
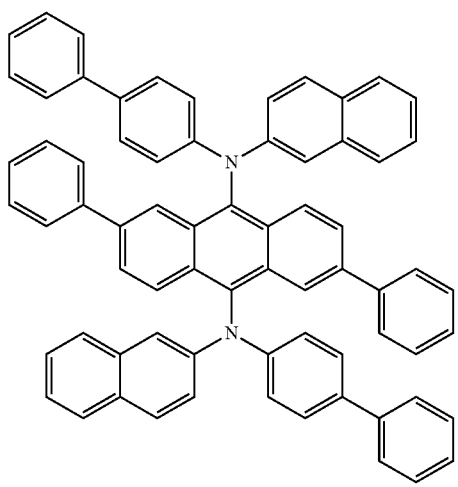
HM-43
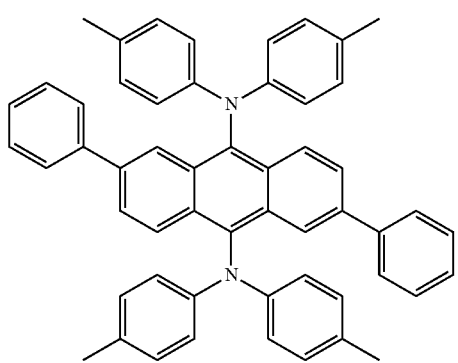
HM-44
-continued
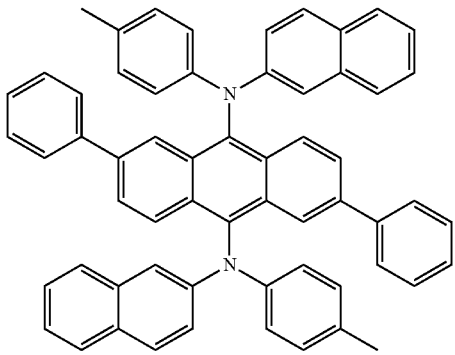
HM-45
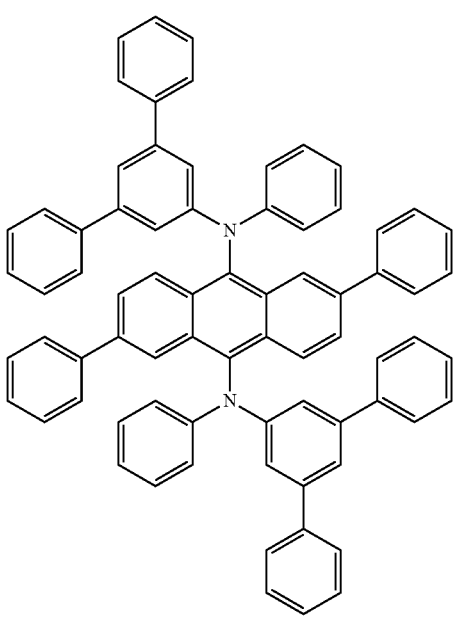
HM-46
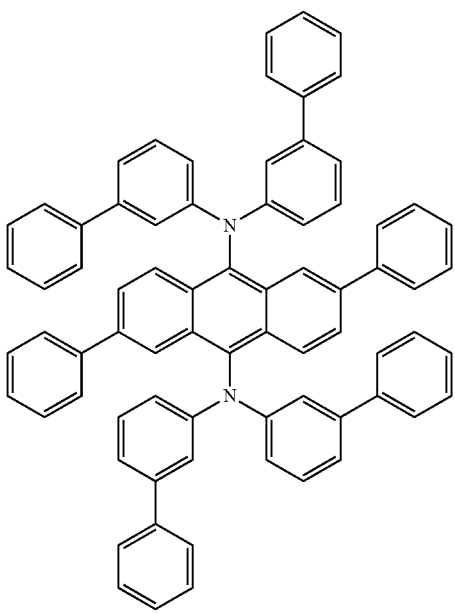
HM-47

HM-48
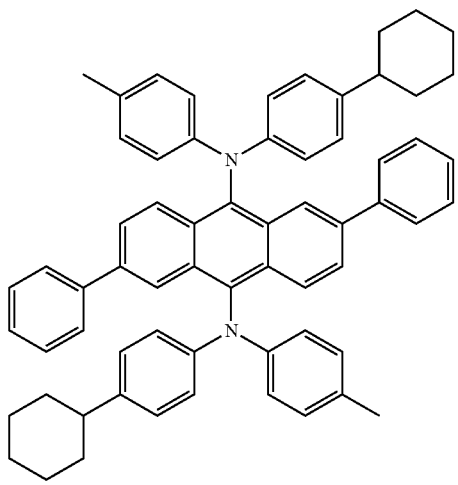
HM-49
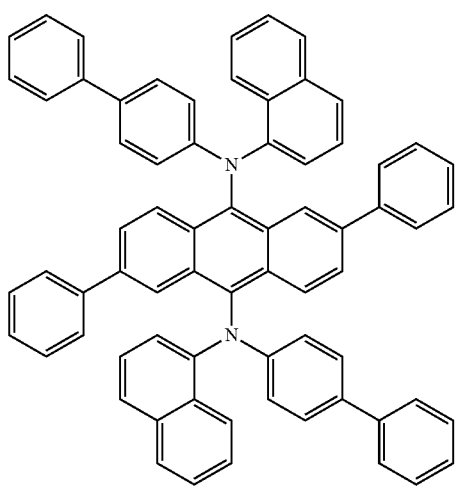
HM-50
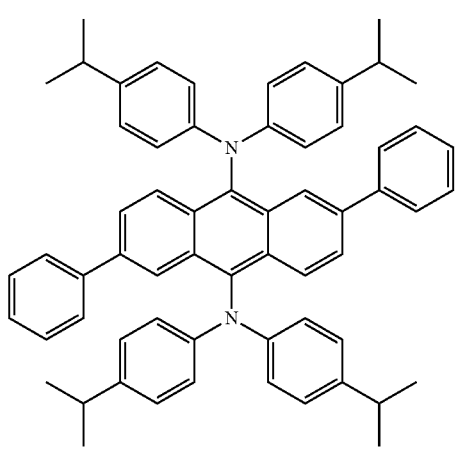
HM-51
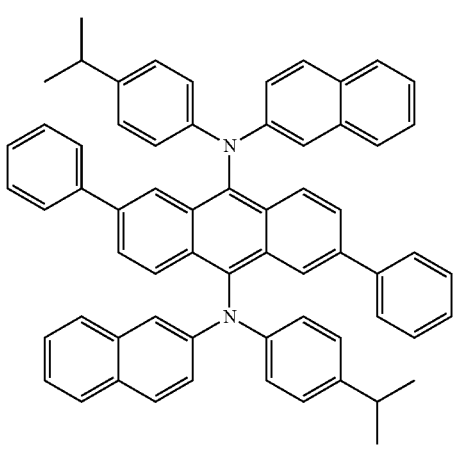
HM-52
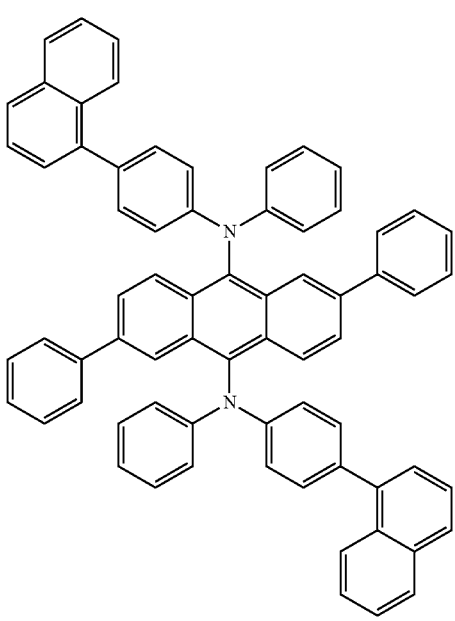
HM-53
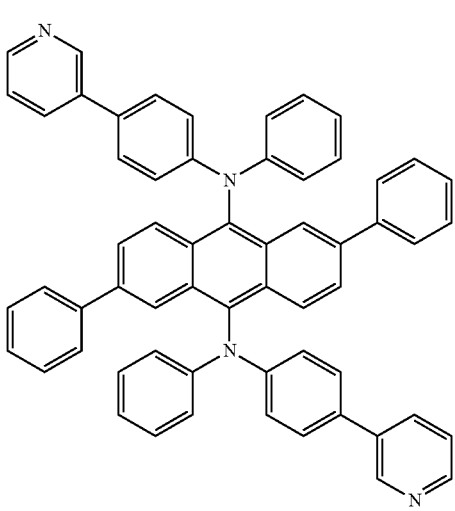

HM-54
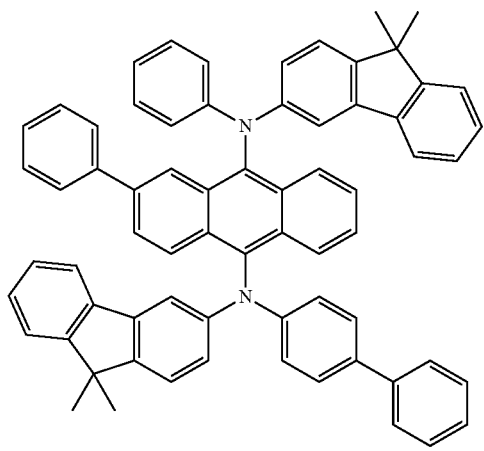
HM-55
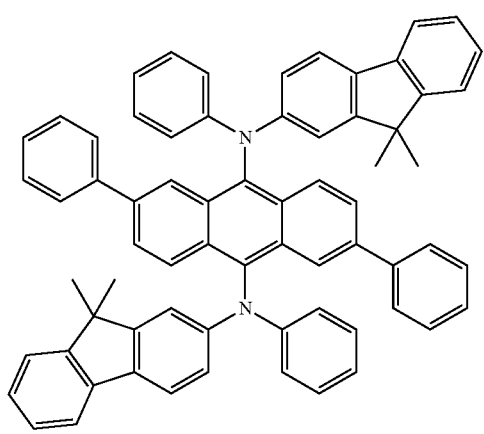
HM-56
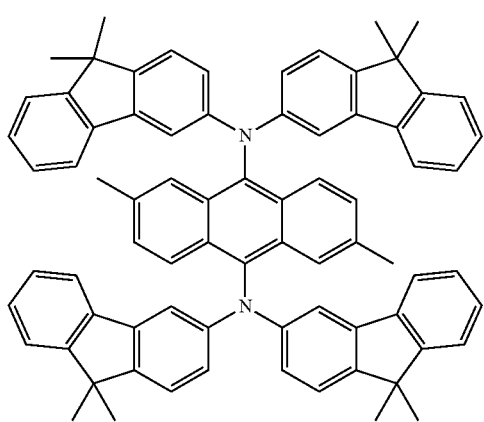
HM-57
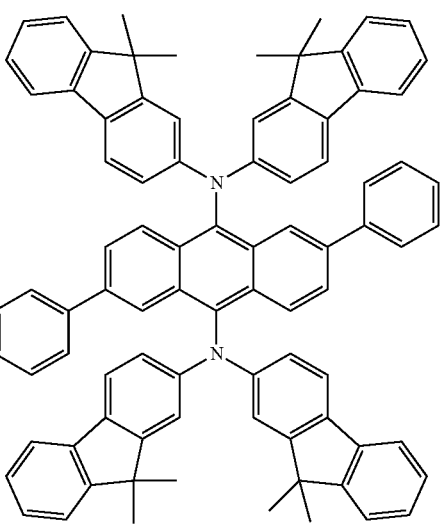
HM-58
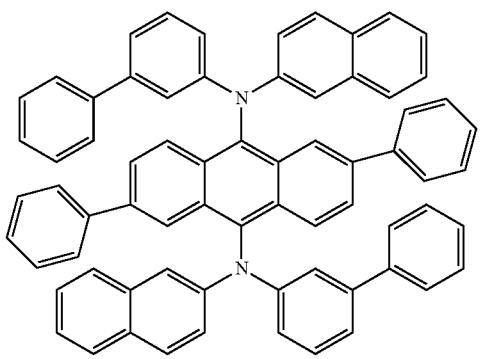
HM-59
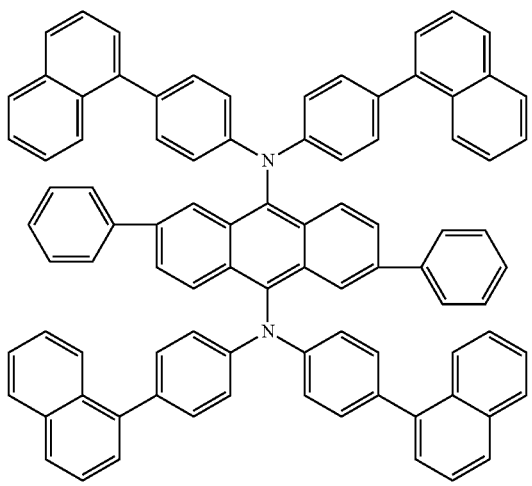

HM-60
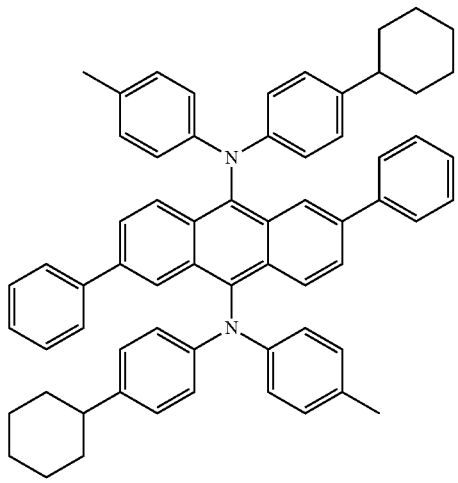
HM-61
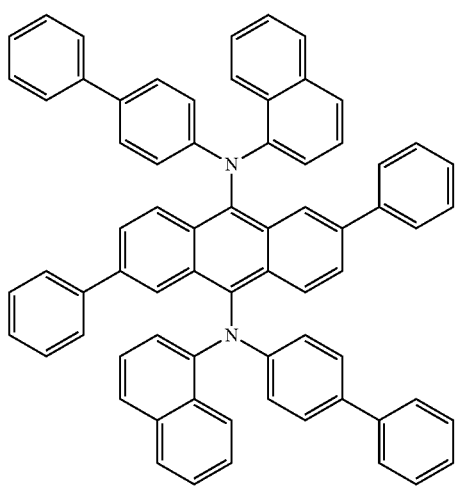
HM-62
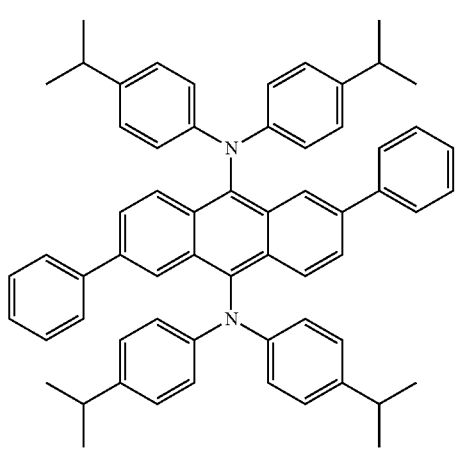
HM-63
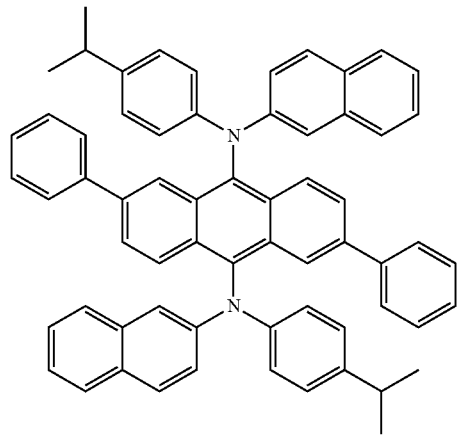
HM-64
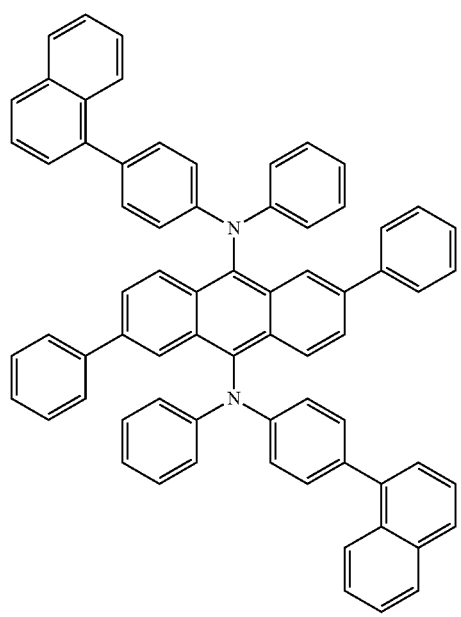
HM-65
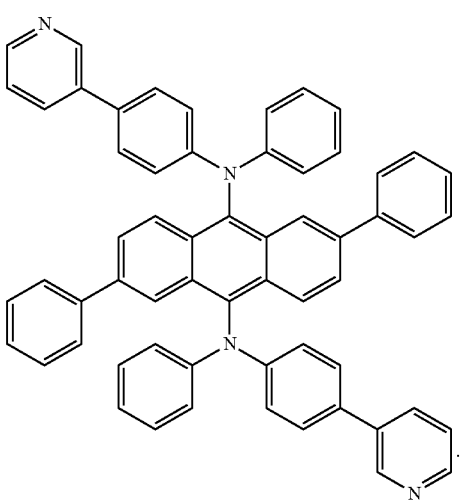
9. The organic light emitting display panel according to claim 1, wherein the first passivation layer is formed of an organic compound having at least one of the structural formulae described in Formula 2 below:

<Formula 2>
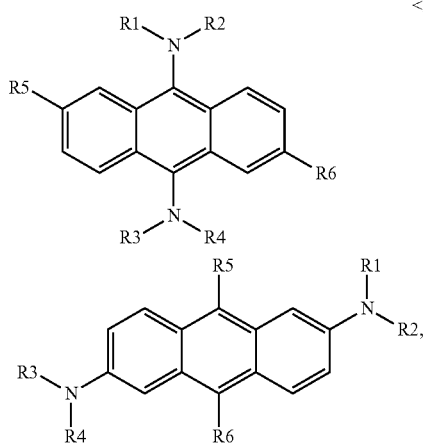
wherein R1, R2, R3, R4, R5, and R6 are each independently selected from substituted or unsubstituted $C_6$-$C_{40}$ aromatic groups.
10. The organic light emitting display panel according to claim 9, wherein the organic compound having at least one of the structural formulae of Formula 2 is selected from the following compounds:
HM-08
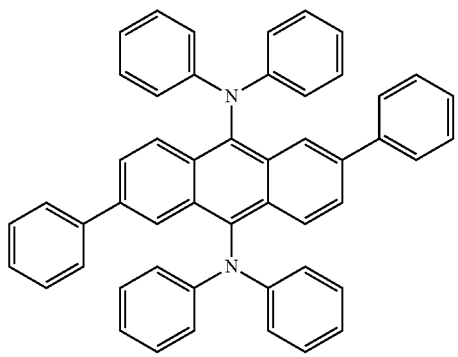
HM-09
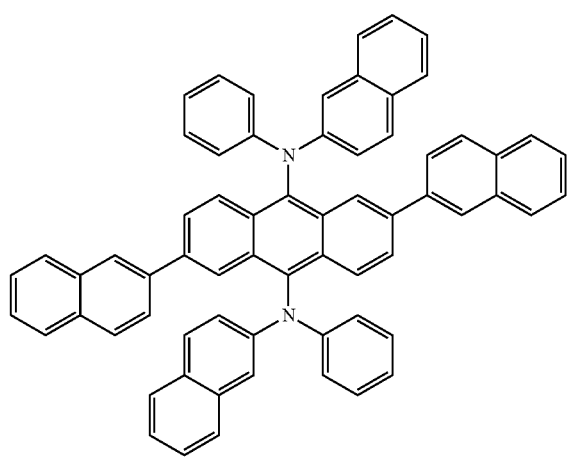
HM-10
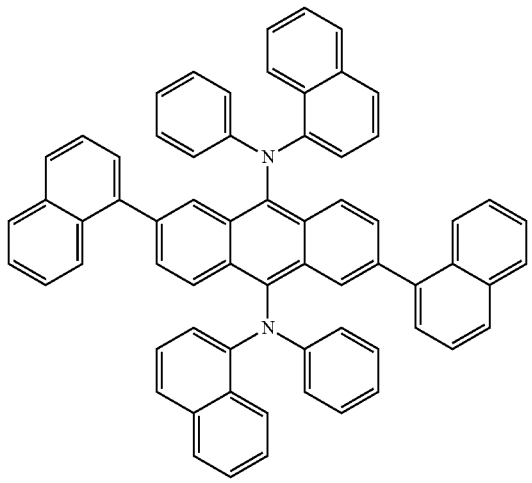
HM-11
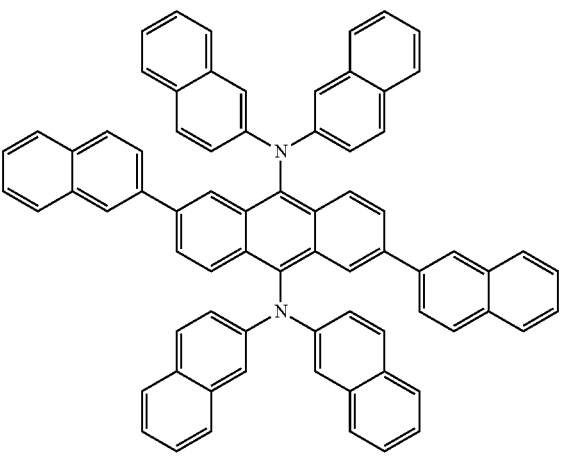
HM-12
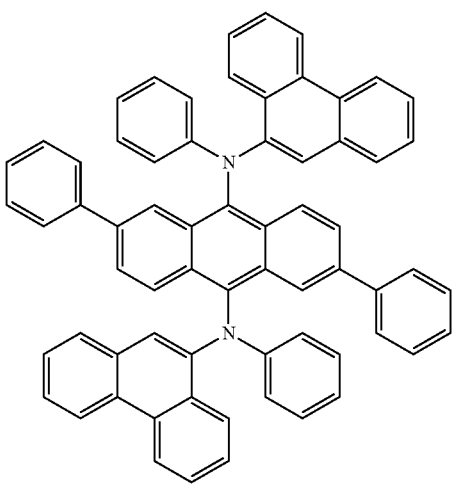

HM-13
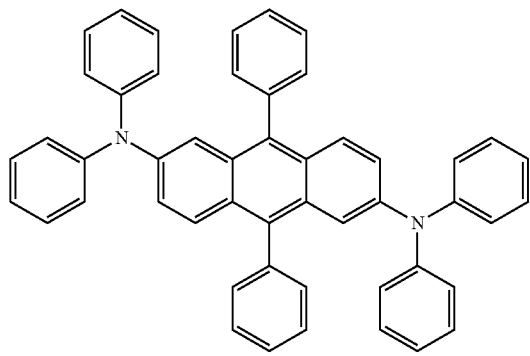
HM-14
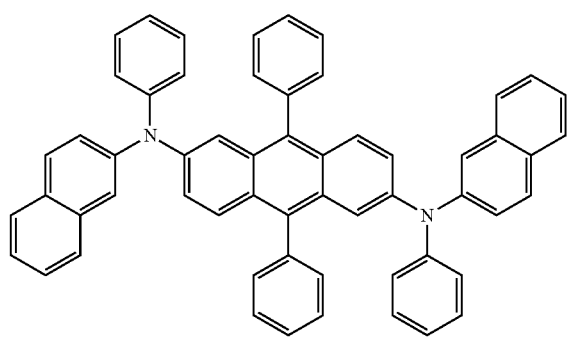
HM-15
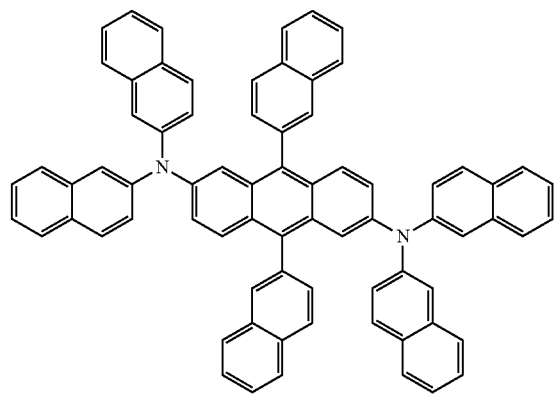
HM-16
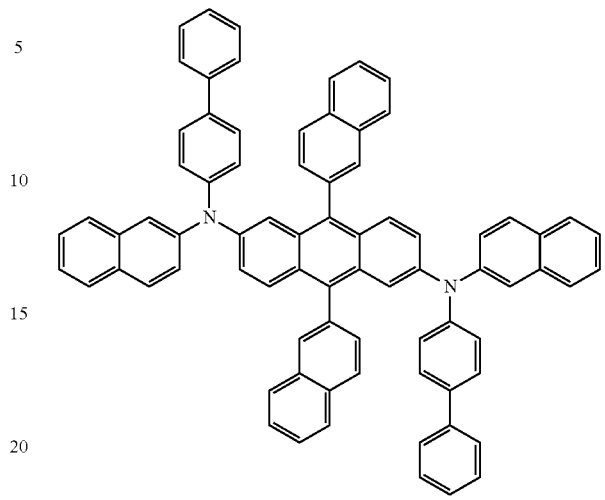
HM-17
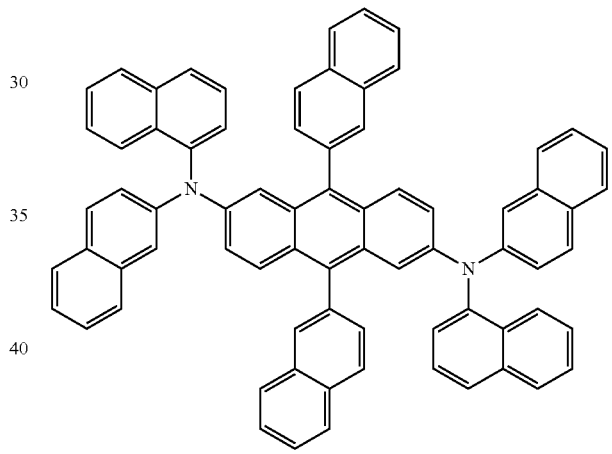
HM-42
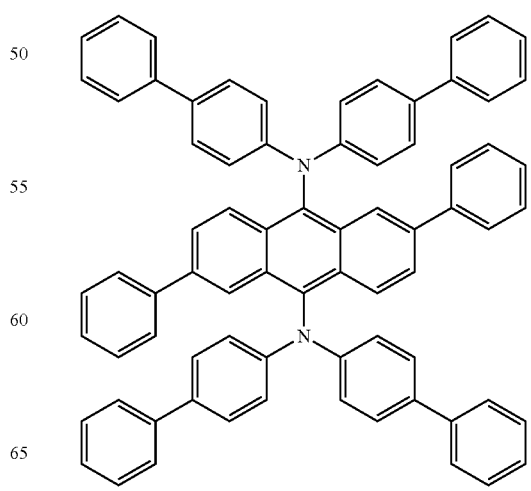

HM-43
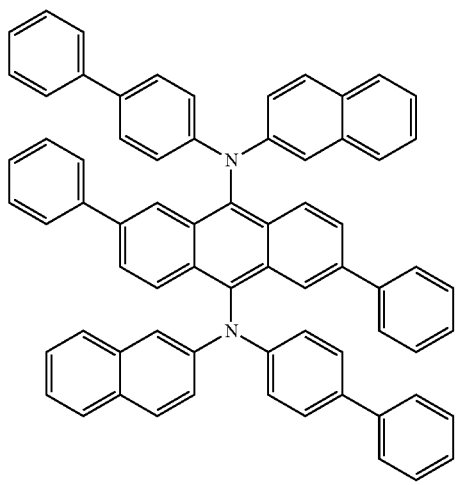
HM-44
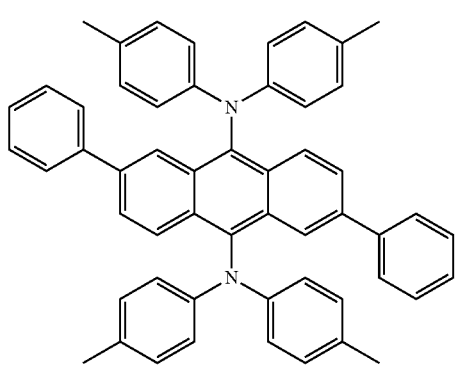
HM-46
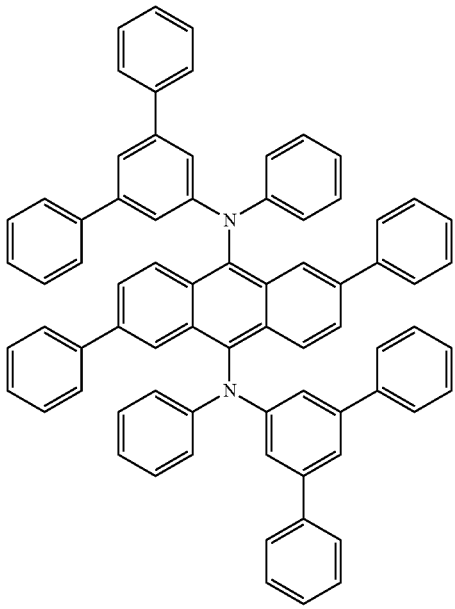
HM-47
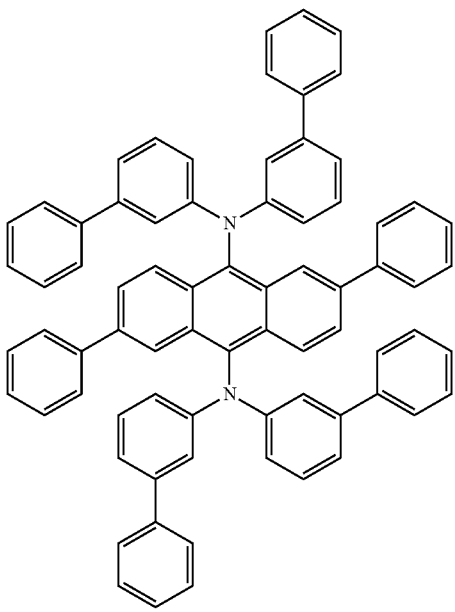
HM-45

HM-48
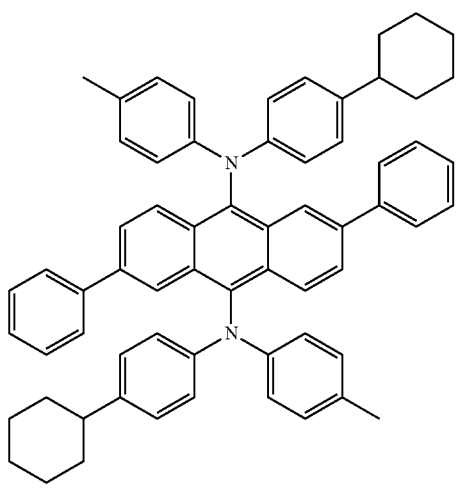
HM-49
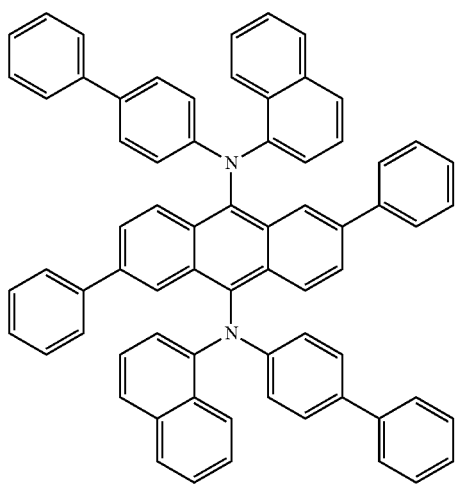
HM-50
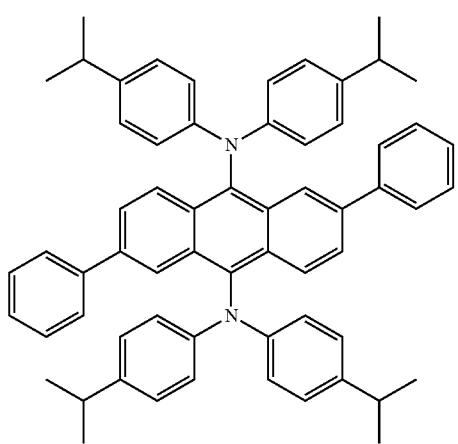
HM-51
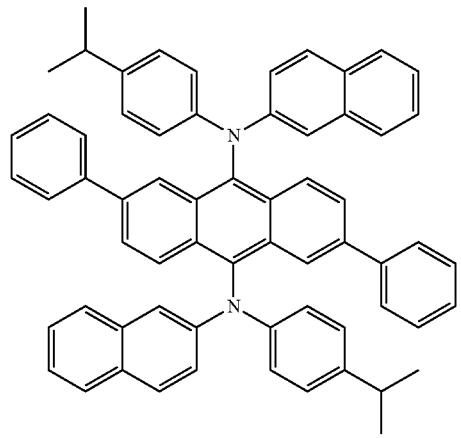
HM-52
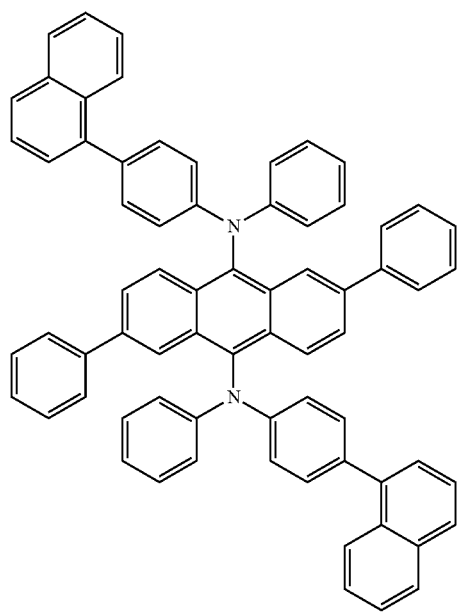
HM-53
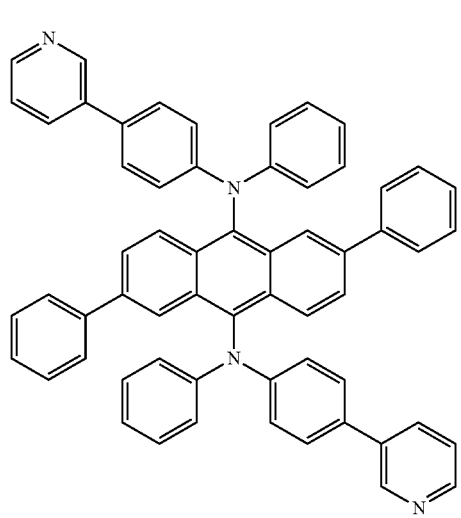

-continued
HM-55
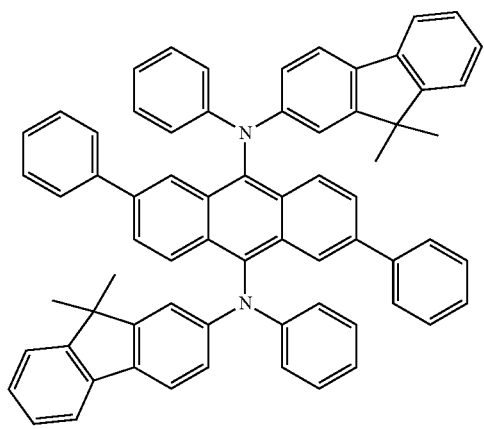
HM-57
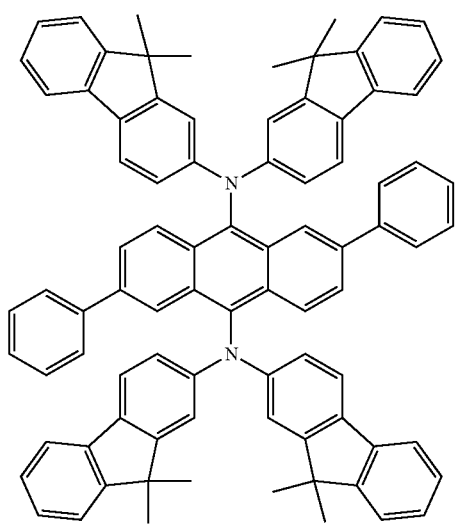
HM-58
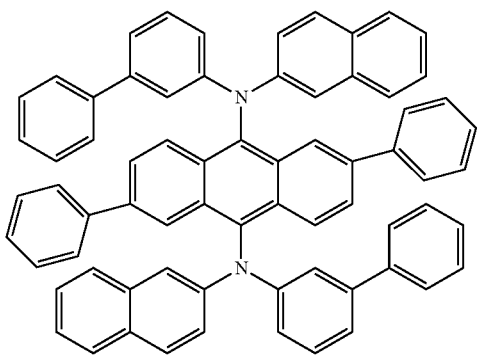
-continued
HM-59
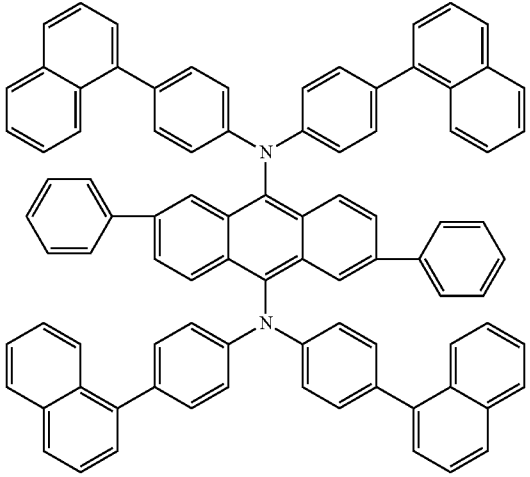
HM-60
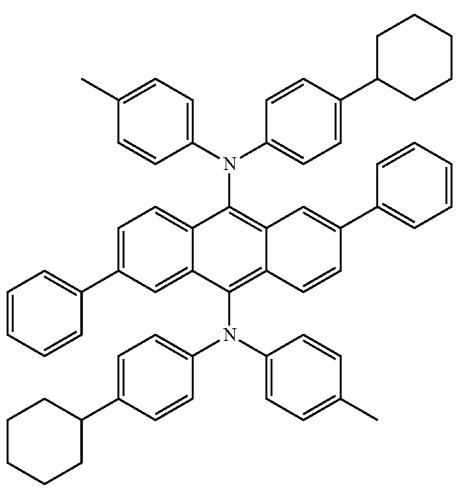
HM-61
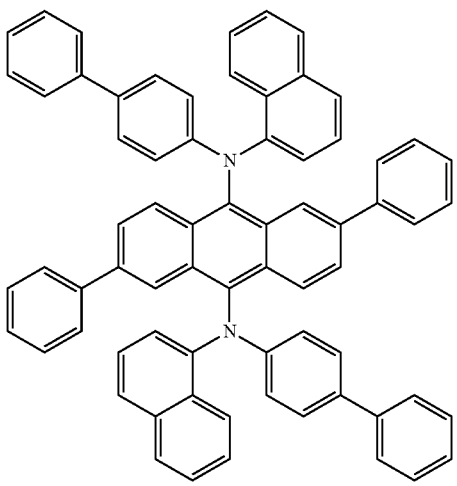

HM-62

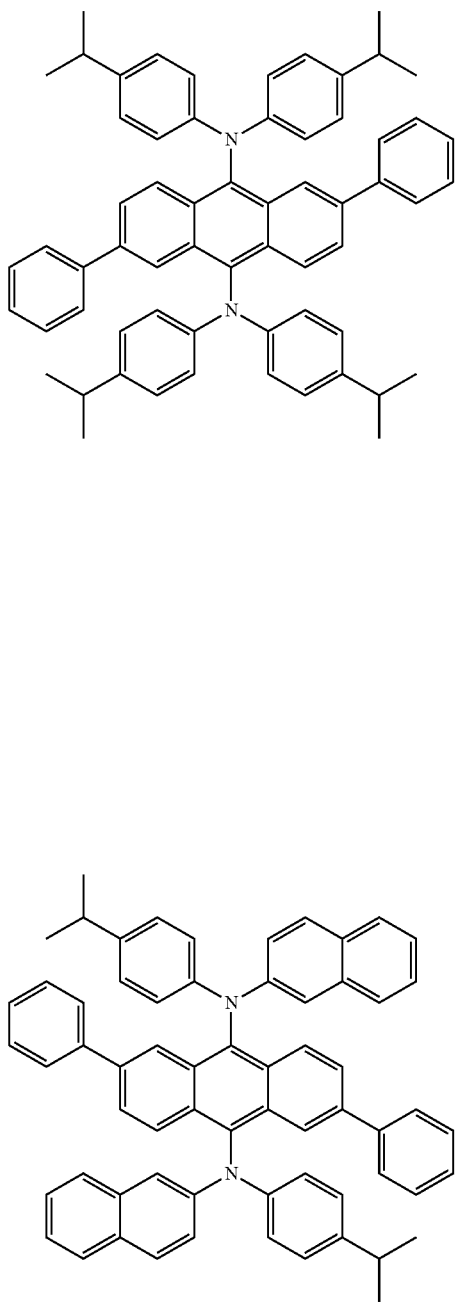

HM-63

HM-64

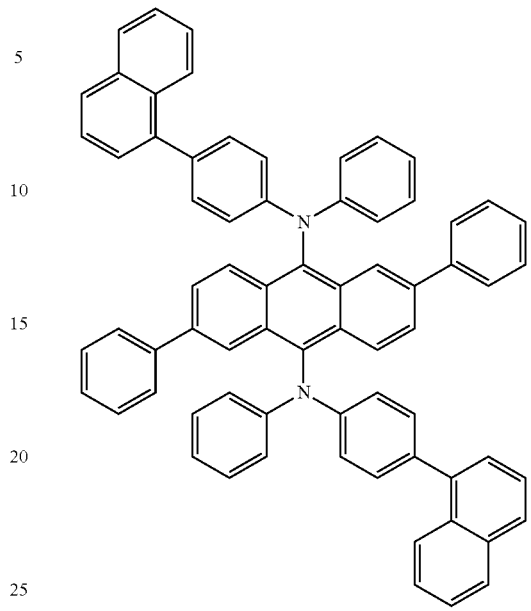

HM-65

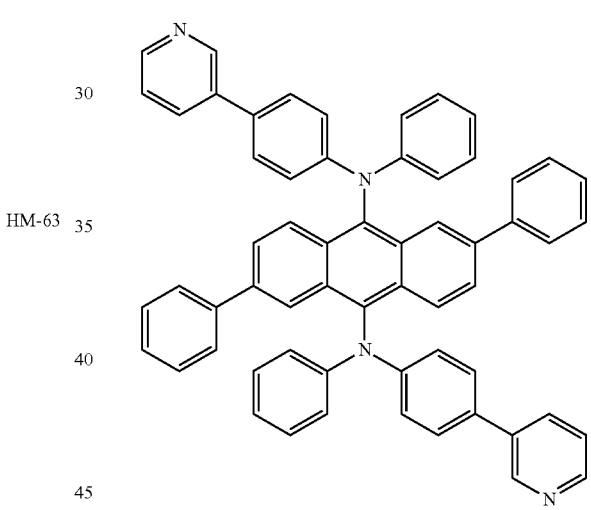

11. The organic light emitting display according to claim 1, wherein the lower storage electrode, and the source and drain regions are doped with the p+ or n+ impurity.

12. The organic light emitting display according to claim 1, wherein the lower storage electrode is formed from the same layer as the active layer.

13. The organic light emitting display according to claim 1, wherein the upper storage electrode is formed from the same layer as the gate electrode.

* * * * *